US011942528B2

(12) United States Patent
Yu et al.

(10) Patent No.: US 11,942,528 B2
(45) Date of Patent: Mar. 26, 2024

(54) SEMICONDUCTOR DEVICES HAVING VARIOUSLY-SHAPED SOURCE/DRAIN PATTERNS

(71) Applicant: Samsung Electronics Co., Ltd., Suwon-si (KR)

(72) Inventors: Hyun-Kwan Yu, Suwon-si (KR); Min-Hee Choi, Suwon-si (KR)

(*) Notice: Subject to any disclaimer, the term of this patent is extended or adjusted under 35 U.S.C. 154(b) by 0 days.

(21) Appl. No.: 18/196,533

(22) Filed: May 12, 2023

(65) Prior Publication Data

US 2023/0282719 A1 Sep. 7, 2023

Related U.S. Application Data

(63) Continuation of application No. 17/131,977, filed on Dec. 23, 2020, now Pat. No. 11,688,781, which is a (Continued)

(30) Foreign Application Priority Data

Jun. 12, 2018 (KR) .................. 10-2018-0067354

(51) Int. Cl.
*H01L 29/417* (2006.01)
*H01L 21/762* (2006.01)
(Continued)

(52) U.S. Cl.
CPC .. *H01L 29/41791* (2013.01); *H01L 21/76224* (2013.01); *H01L 21/823425* (2013.01); *H01L 21/823431* (2013.01); *H01L 27/0886* (2013.01)

(58) Field of Classification Search
CPC ......... H01L 29/41791; H01L 21/76224; H01L 21/823425; H01L 21/823431; H01L 27/0886; H01L 21/823418; H01L 21/823814; H01L 21/823821; H01L 27/0924; H01L 29/7848
See application file for complete search history.

(56) References Cited

U.S. PATENT DOCUMENTS 9,437,496 B1   9/2016  Chudzik et al.
9,613,960 B2   4/2017  Li et al.
(Continued)

FOREIGN PATENT DOCUMENTS

CN   107068671 A     8/2017
JP   2007311805 A   11/2007
KR   20170091983 A   8/2017

*Primary Examiner* — Tucker J Wright
(74) *Attorney, Agent, or Firm* — Myers Bigel, P.A.

(57) ABSTRACT

A semiconductor device comprising a plurality of active patterns on a substrate. The semiconductor device may include a device isolation layer defining the plurality of active patterns, a gate electrode extending across the plurality of active patterns, and a source/drain pattern on the active patterns. The plurality of active patterns may comprise a first active pattern and a second active pattern. The source/drain pattern comprises a first part on the first active pattern, a second part on the second active pattern, and a third part extending from the first part and along an upper portion of the first active pattern. The device isolation layer comprises a first outer segment on a sidewall of the first active pattern below the source/drain pattern. A lowermost level of a bottom surface of the third part may be lower than an uppermost level of a top surface of the first outer segment.

20 Claims, 37 Drawing Sheets

Related U.S. Application Data continuation of application No. 16/252,919, filed on Jan. 21, 2019, now Pat. No. 10,896,964.

(51) Int. Cl.
*H01L 21/8234* (2006.01)
*H01L 27/088* (2006.01)

(56) References Cited

U.S. PATENT DOCUMENTS

| | | |
|---|---|---|
| 9,812,576 B2 | 11/2017 | Lee et al. |
| 9,825,036 B2 | 11/2017 | Lee et al. |
| 9,859,387 B2 | 1/2018 | Kim et al. |
| 10,090,413 B2 | 10/2018 | Kim et al. |
| 2016/0086857 A1 | 3/2016 | Zhang et al. |
| 2016/0284697 A1 | 9/2016 | Yoon et al. |
| 2017/0148797 A1 | 5/2017 | Kim et al. |
| 2017/0148914 A1 | 5/2017 | Lee et al. |
| 2017/0162671 A1 | 6/2017 | Basker et al. |
| 2017/0345933 A1 | 11/2017 | Fung |
| 2018/0040615 A1 | 2/2018 | Chang et al. |

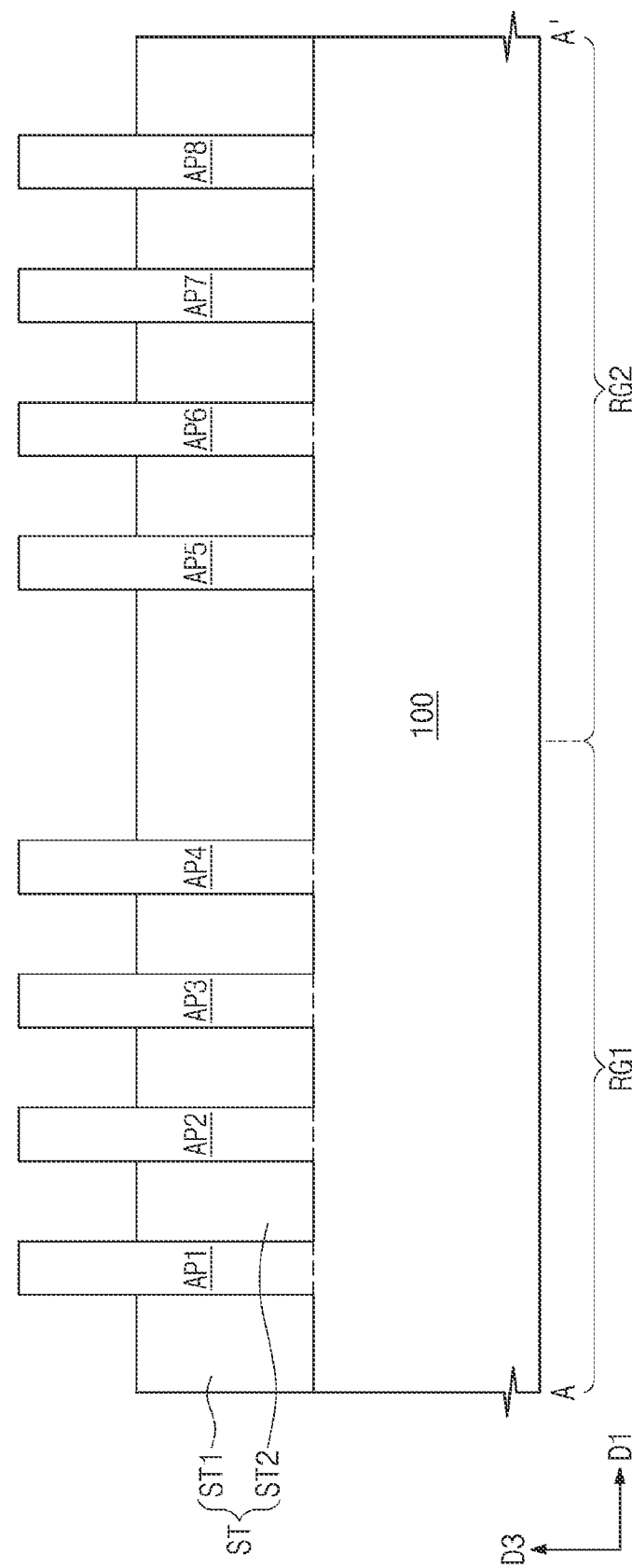

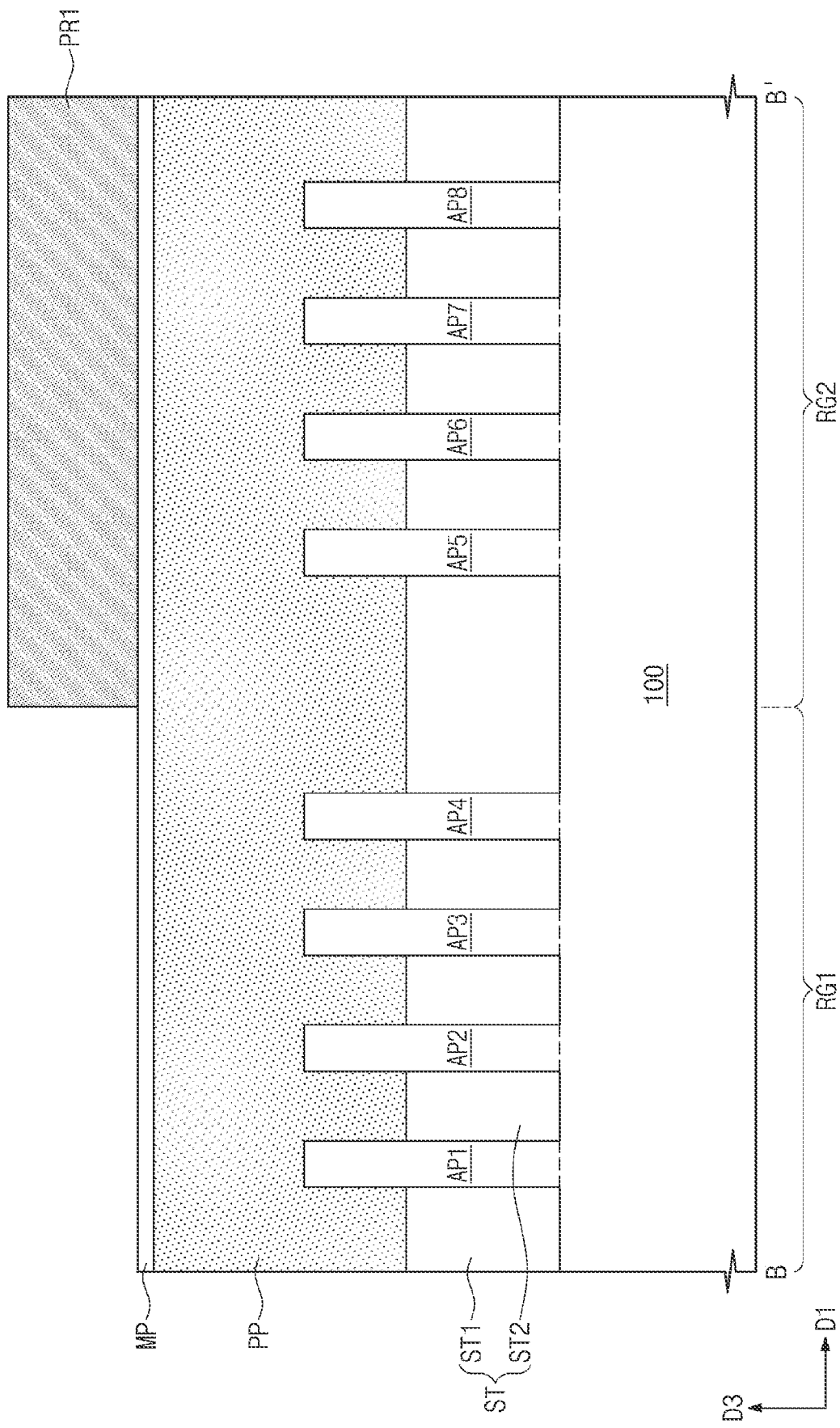

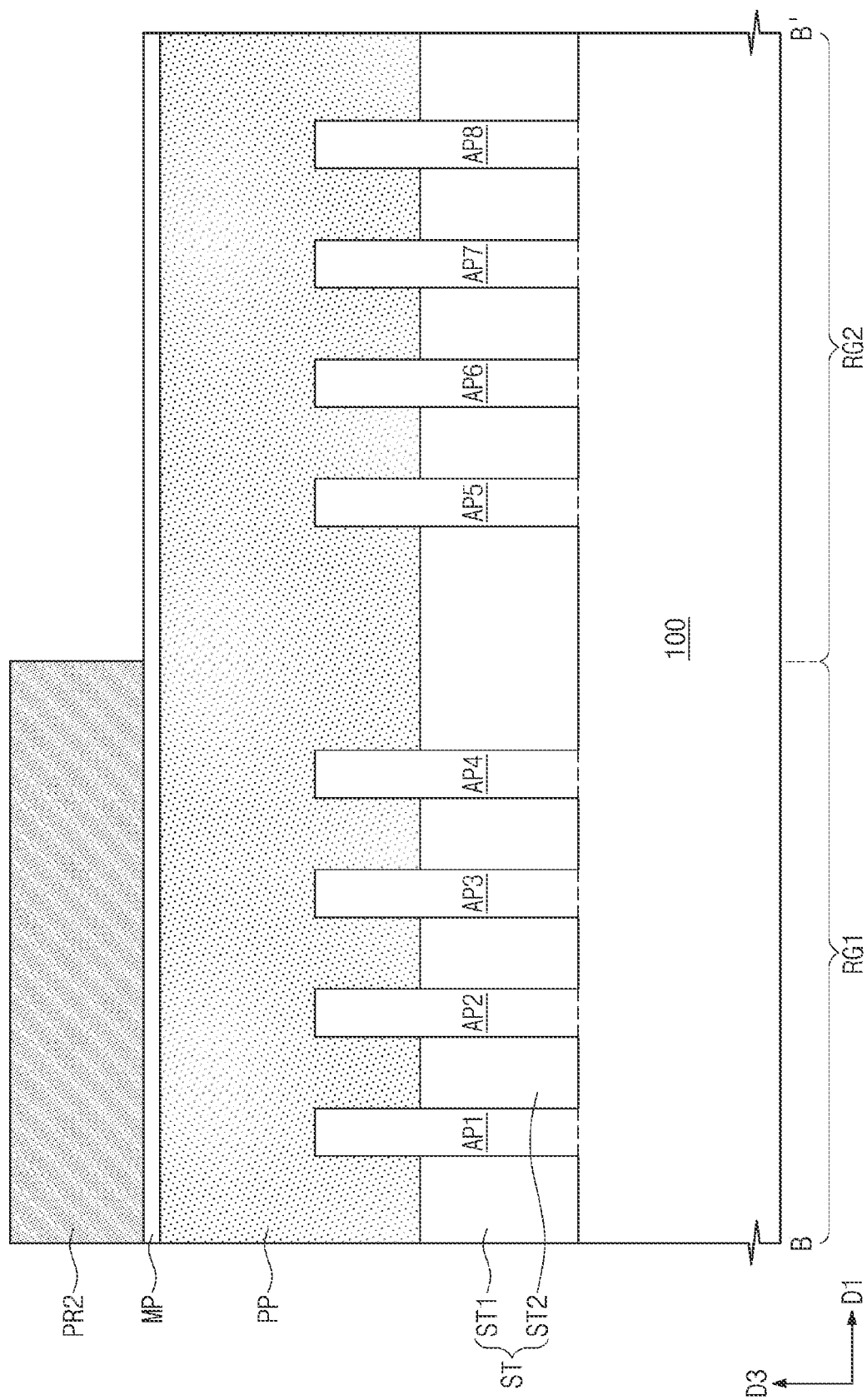

SEMICONDUCTOR DEVICES HAVING VARIOUSLY-SHAPED SOURCE/DRAIN PATTERNS

CROSS-REFERENCE TO RELATED APPLICATIONS

This application is a continuation of U.S. application Ser. No. 17/131,977, filed on Dec. 23, 2020, which in turn is a continuation of U.S. application Ser. No. 16/252,919, filed on Jan. 21, 2019, which claims the benefit of priority under 35 U.S.C. § 119 to Korean Patent Application No. 10-2018-0067354, filed on Jun. 12, 2018, in the Korean Intellectual Property Office, and the entire contents of each above-identified application are hereby incorporated by reference.

TECHNICAL FIELD

The present inventive concepts relate to semiconductor devices, and more particularly, to semiconductor devices having variously shaped source/drain patterns.

BACKGROUND

Semiconductor devices are beneficial in the electronic industry, and in other industries for many reasons, such as their small size, their multi-functionality, and/or their low fabrication cost. Semiconductor devices may encompass semiconductor memory devices storing logic data, semiconductor logic devices processing operations of logic data, and hybrid semiconductor devices having both memory and logic elements. The advancing development of the electronic industry and other industries has made semiconductor devices with increasing integration increasingly desirable. For example, semiconductor devices having high reliability, high speed, and/or multi-functionality have been increasingly requested. Semiconductor devices are becoming gradually more complicated and more integrated to meet these requested characteristics.

SUMMARY

The inventive concepts disclosed herein provide semiconductor devices with improved electrical characteristics.

According to some example embodiments of the present inventive concepts, a semiconductor device may comprise: a plurality of active patterns on a substrate; a device isolation layer defining the plurality of active patterns; a gate electrode extending across the plurality of active patterns; and a source/drain pattern on the plurality of active patterns. The plurality of active patterns may comprise: a first active pattern; and a second active pattern. The source/drain pattern may comprise: a first part on the first active pattern; a second part on the second active pattern; and a third part extending from the first part and along an upper portion of the first active pattern. The device isolation layer may comprise a first outer segment on a sidewall of the first active pattern and below the source/drain pattern. A lowermost level of a bottom surface of the third part of the source/drain pattern may be lower than an uppermost level of a top surface of the first outer segment.

According to some example embodiments of the present inventive concepts, a semiconductor device may comprise: a plurality of active patterns on a substrate; a device isolation layer defining the plurality of active patterns; a gate electrode extending across the active patterns; and a source/drain pattern on the plurality of active patterns. The plurality of active patterns may comprise first, second, and third active patterns. The second active pattern may be between the first and third active patterns. The source/drain pattern may comprise: a first part on the first active pattern; a second part on the second active pattern; and a third part on the third active pattern. The first, second, and third parts of the source/drain pattern may be merged with each other. A first valley having a first depth may be defined between the first and second parts of the source/drain pattern. A second valley having a second depth may be defined between the second and third parts of the source/drain pattern. The second depth may be less than the first depth.

According to some example embodiments of the present inventive concepts, a semiconductor device may comprise: a substrate; first, second, and third active patterns on the substrate; a gate electrode extending across the first, second, and third active patterns; and a source/drain pattern on the first, second, and third active patterns. The source/drain pattern may comprise first, second, and third parts respectively on the first, second, and third active patterns. The first and second parts of the source/drain pattern may be spaced apart from each other. The second and third parts of the source/drain pattern may be merged with each other. A lowermost level of a bottom surface of the second part of the source/drain pattern may be lower than a lowermost level of a bottom surface of the third part of the source/drain pattern.

BRIEF DESCRIPTION OF THE DRAWINGS

FIGS. 6B, 7B, 8B, 9B, 10B, and 11B illustrate cross-sectional views taken along line A-A' of FIGS. 6A, 7A, 8A, 9A, 10A, and 11A, respectively.

FIGS. 7C, 8C, 9C, 10C, and 11C illustrate cross-sectional views taken along line B-B' of FIGS. 7A, 8A, 9A, 10A, and 11A, respectively.

DETAILED DESCRIPTION

FIGS. 1A, 2A, 3A, and 4A illustrate plan views showing operations of methods of manufacturing semiconductor devices according to some of the present inventive concepts. FIGS. 1B, 2B, 3B, and 4B illustrate cross-sectional views taken along line A-A' of FIGS. 1A, 2A, 3A, and 4A, respectively. FIGS. 2C, 3C, and 4C illustrate cross-sectional views taken along line B-B' of FIGS. 2A, 3A, and 4A, respectively. FIGS. 2D, 3D, and 4D illustrate cross-sectional views taken along line C-C' of FIGS. 2A, 3A, and 4A, respectively.

Figure 1A:
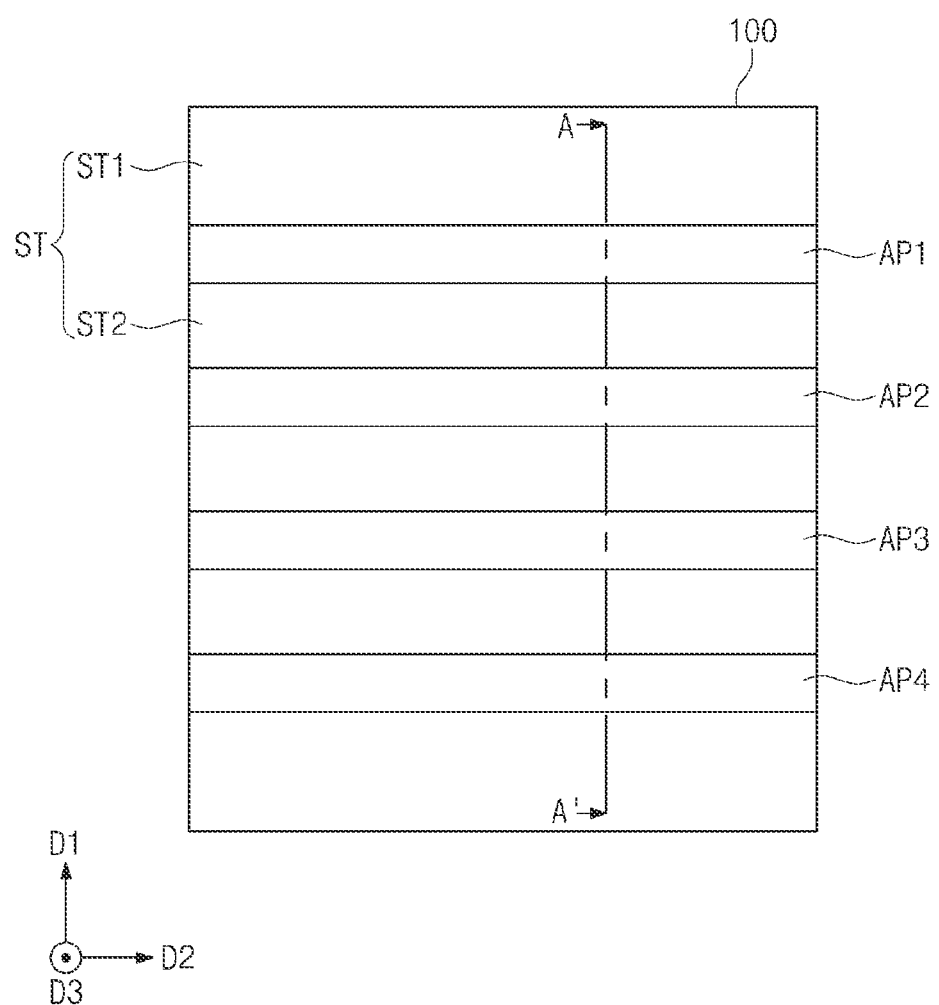
FIGS. 1A, 2A, 3A, and 4A illustrate plan views showing operations in methods of manufacturing semiconductor devices, according to some of the present inventive concepts.
Figure 1B:
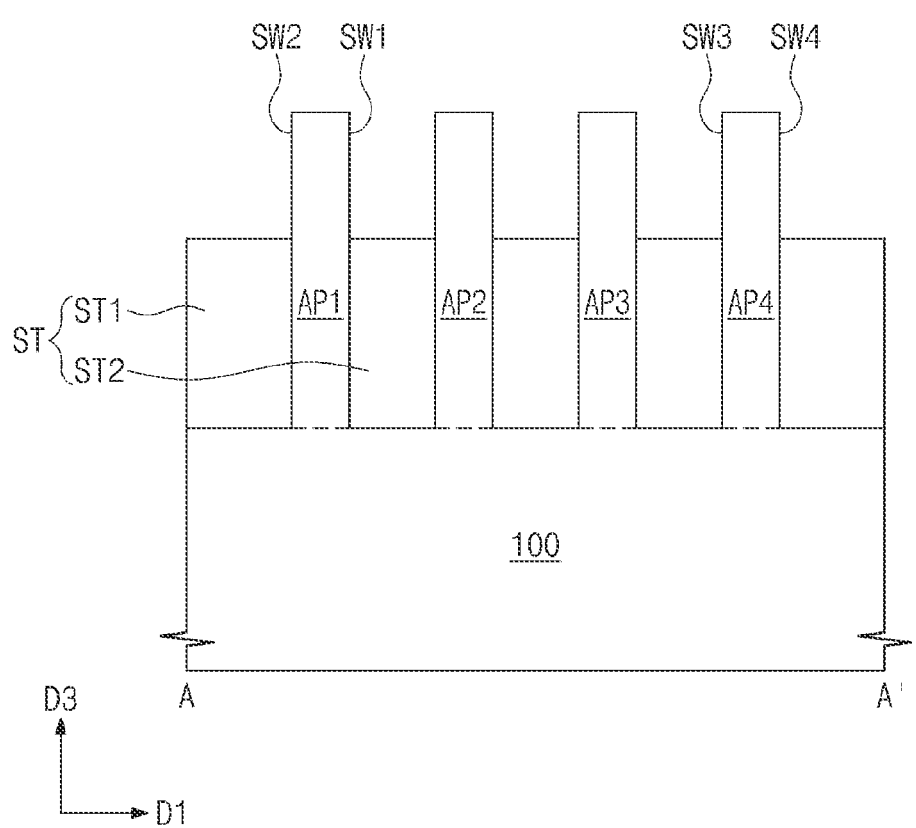
FIGS. 1B, 2B, 3B, and 4B illustrate cross-sectional views taken along line A-A' of FIGS. 1A, 2A, 3A, and 4A, respectively.
Figure 2A:
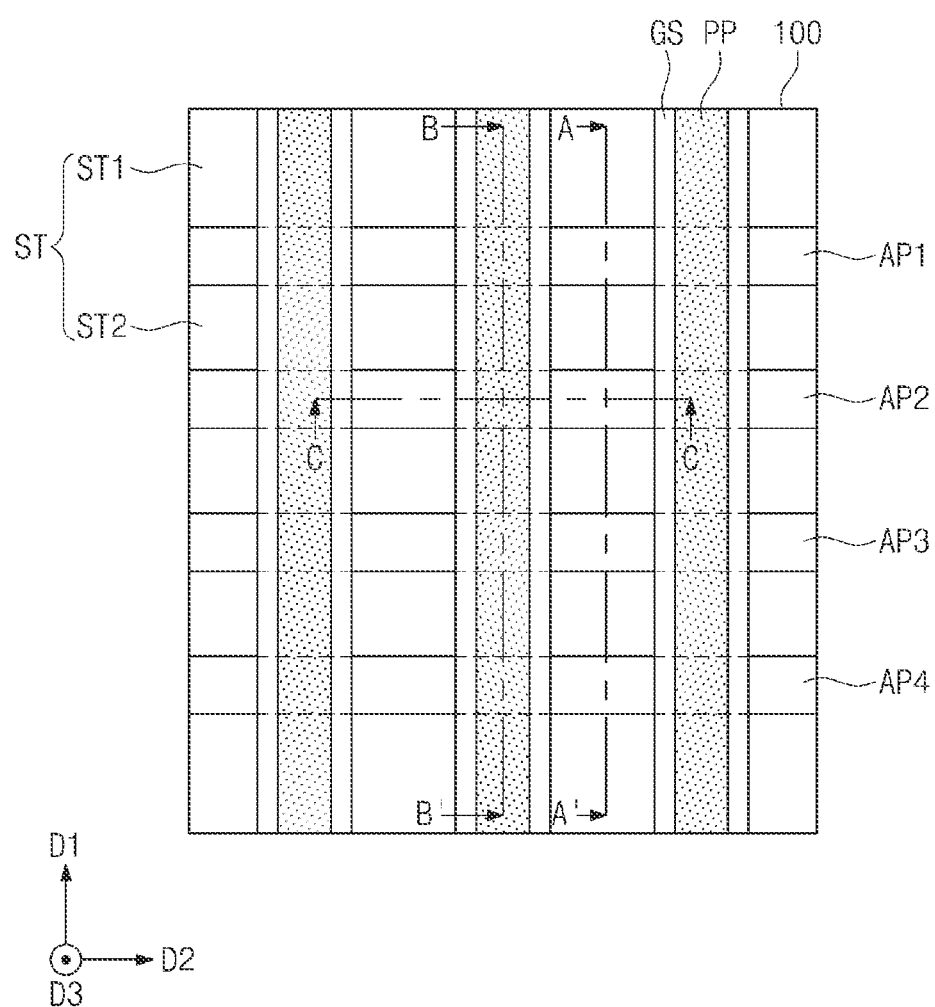
Figure 2B:
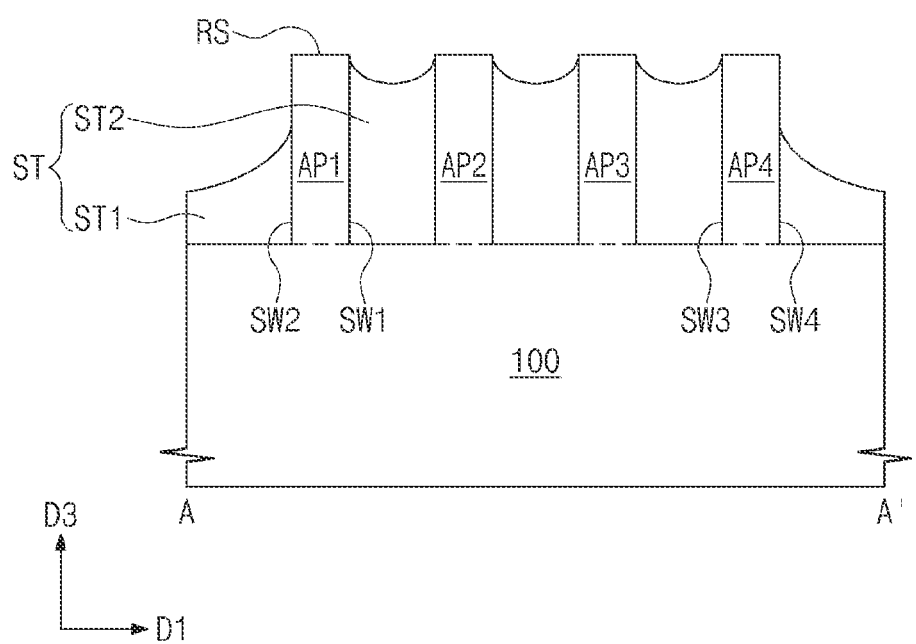
Figure 2C:
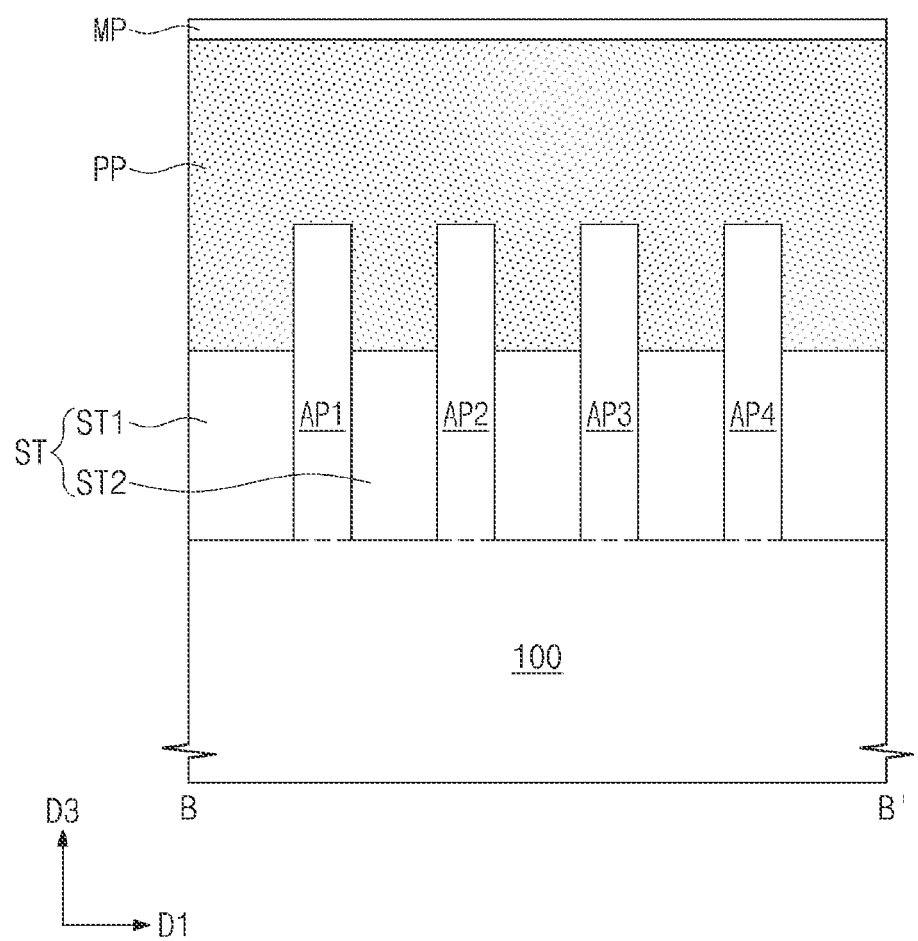
FIGS. 2C, 3C, and 4C illustrate cross-sectional views taken along line B-B' of FIGS. 2A, 3A, and 4A, respectively.
Figure 2D:
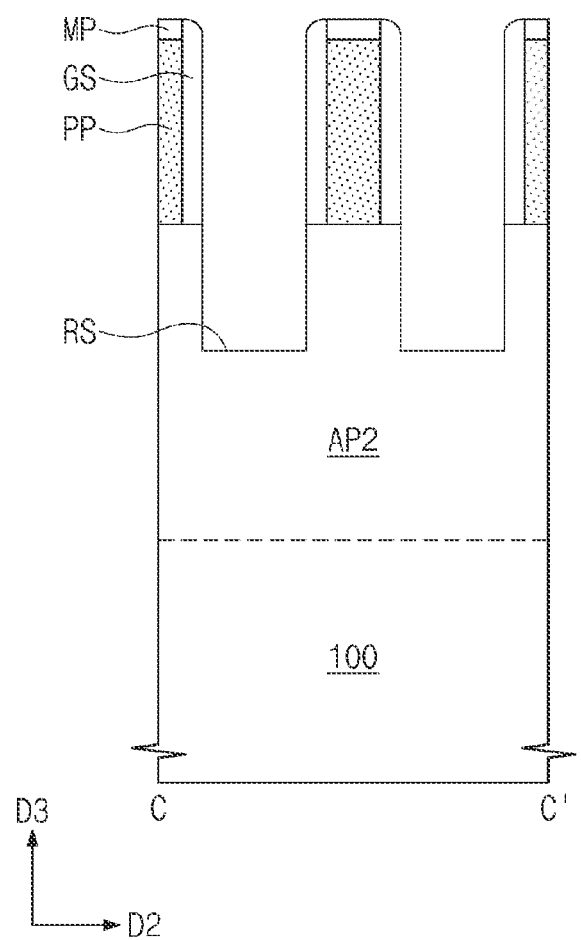
FIGS. 2D, 3D, and 4D illustrate cross-sectional views taken along line C-C' of FIGS. 2A, 3A, and 4A, respectively.

Referring to FIGS. 1A and 1B, a substrate 100 may be provided. The substrate 100 may be a semiconductor substrate, or may include a semiconductor substrate. For example, the substrate 100 may be a silicon substrate, a germanium substrate, or a silicon-on-insulator (SOI) substrate.

A device isolation layer ST may be formed on the substrate 100. The formation of the device isolation layer ST may include patterning the substrate 100 to form trenches defining first to fourth active patterns AP1 to AP4, forming an insulation layer on an entire surface of the substrate 100, and recessing the insulation layer. The device isolation layer ST may have a top surface lower than those of the first to fourth active patterns AP1 to AP4.

The device isolation layer ST may define the first to fourth active patterns AP1 to AP4 on an upper portion of the substrate 100. Each of the first to fourth active patterns AP1 to AP4 may have a linear or bar shape extending in a second direction D2.

The first to fourth active patterns AP1 to AP4 may be sequentially arranged along a first direction D1. The first to fourth active patterns AP1 to AP4 may be spaced apart from each other in the first direction D1. In some embodiments, the first to fourth active patterns AP1 to AP4 may be equally spaced apart from each other in the first direction D1. The first and fourth active patterns AP1 and AP4 may be active patterns positioned at outermost positions. For example, the first and fourth active patterns AP1 and AP4 may be outermost active patterns. The second and third active patterns AP2 and AP3 may be between the first and fourth active patterns AP1 and AP4. For example, the second and third active patterns AP2 and AP3 may be inner active patterns. The first active pattern AP1 may include a first sidewall SW1 and a second sidewall SW2. The first sidewall SW1 may face the second active pattern AP2. The second sidewall SW2 may stand opposite to the first sidewall SW1. The fourth active pattern AP4 may include a third sidewall SW3 and a fourth sidewall SW4. The third sidewall SW3 may face the third active pattern AP3. The fourth sidewall SW4 may stand opposite to the third sidewall SW3. The second active pattern AP2 and the third active pattern AP3 may have sidewalls, which are unlabeled in FIG. 1B.

The device isolation layer ST may include outer segments ST1 and intermediate segments ST2. The outer segments ST1 may be formed on the second sidewall SW2 of the first active pattern AP1 and on the fourth sidewall SW4 of the fourth active pattern AP4. The intermediate segments ST2 may be formed between the first and second active patterns AP1 and AP2, between the second and third active patterns AP2 and AP3, and between the third and fourth active patterns AP3 and AP4.

Referring to FIGS. 2A to 2D, sacrificial patterns PP may be formed to run across the first to fourth active patterns AP1 to AP4. Each of the sacrificial patterns PP may have a linear or bar shape extending in the first direction D1. Each of the sacrificial patterns PP may be perpendicular to the first through fourth active patterns AP1 to AP4, when viewed in a plan view.

The formation of the sacrificial patterns PP may include forming a sacrificial layer on the substrate 100, forming mask patterns MP on the sacrificial layer, and using the mask patterns MP as an etching mask to etch the sacrificial layer. The sacrificial layer may be formed using polysilicon. The mask patterns MP may be formed using a silicon oxide layer, a silicon nitride layer, or a silicon oxynitride layer.

A pair of gate spacers GS may be formed on opposite sidewalls of each of the sacrificial patterns PP. For example, the gate spacers GS may include one or more of SiCN, SiCON, and SiN. For another example, the gate spacers GS may include a multiple layer consisting of two or more of SiCN, SiCON, and SiN.

The formation of the gate spacers GS may include performing a deposition process, such as CVD or ALD, to form a spacer layer on the entire surface of the substrate 100, and performing an anisotropic etching process on the spacer layer.

The mask patterns MP and the gate spacers GS may be used as an etching mask to etch the first to fourth active patterns AP1 to AP4. The first to fourth active patterns AP1 to AP4 may be etched to form recesses RS, as best seen in FIG. 2D.

The device isolation layer ST may be etched at the same time when the first to fourth active patterns AP1 to AP4 are etched. The outer segment ST1 of the device isolation layer ST may have an etched top surface at a level lower than that of an etched top surface of the intermediate segment ST2 of the device isolation layer ST. The second sidewall SW2 of the first active pattern AP1 and the fourth sidewall SW4 of the fourth active pattern AP4 may be partially exposed by the outer segments ST1 of the device isolation layer ST, as best seen in FIG. 2B.

Referring to FIGS. 3A to 3D, source/drain patterns SD may be formed to fill the recesses RS. The formation of the source/drain patterns SD may include performing a selective epitaxial growth process in which the first to fourth active patterns AP1 to AP4 are used as seed layers. After the selective epitaxial growth process, the source/drain patterns SD may be doped with P-type impurities or N-type impurities. The source/drain pattern SD may have a flat top surface.

Figure 3A:
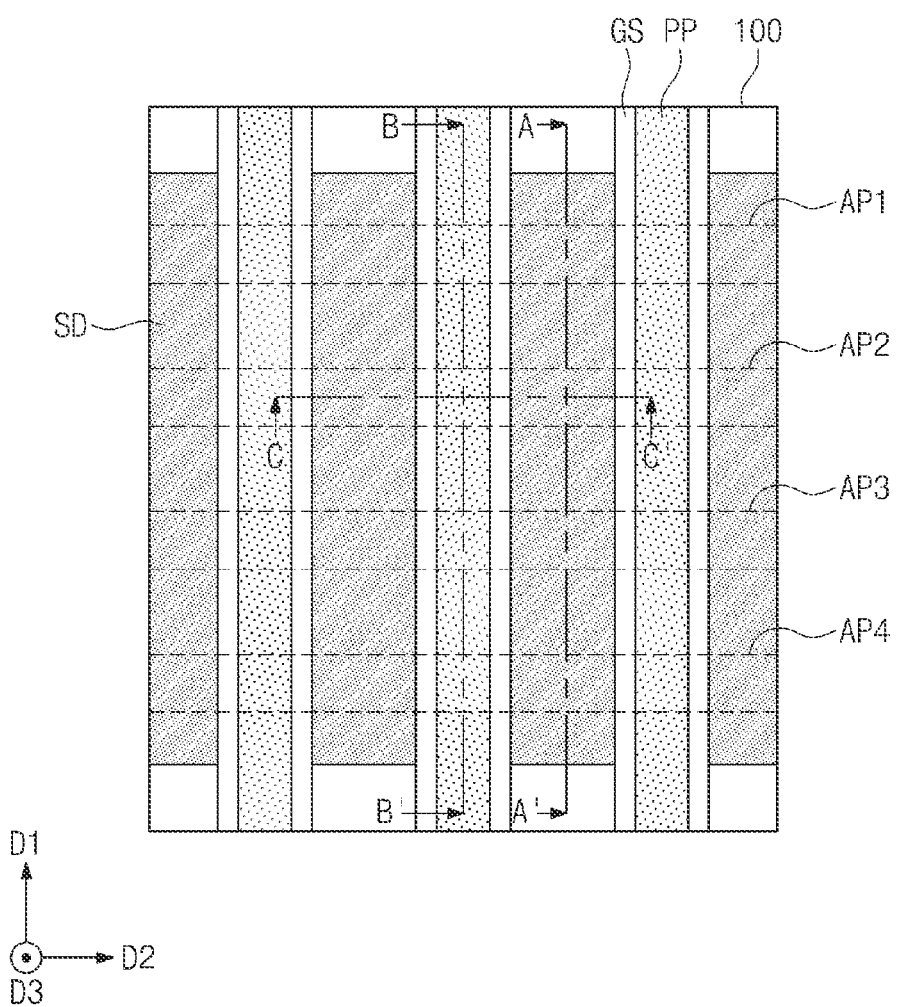
Figure 3B:
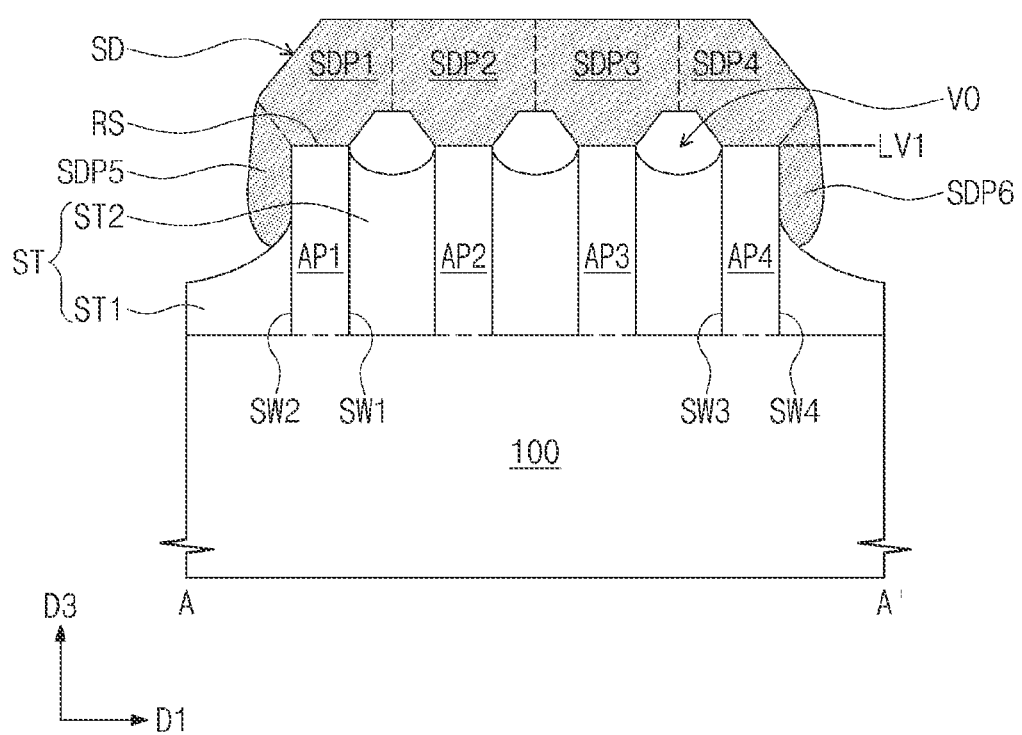
Figure 3C:
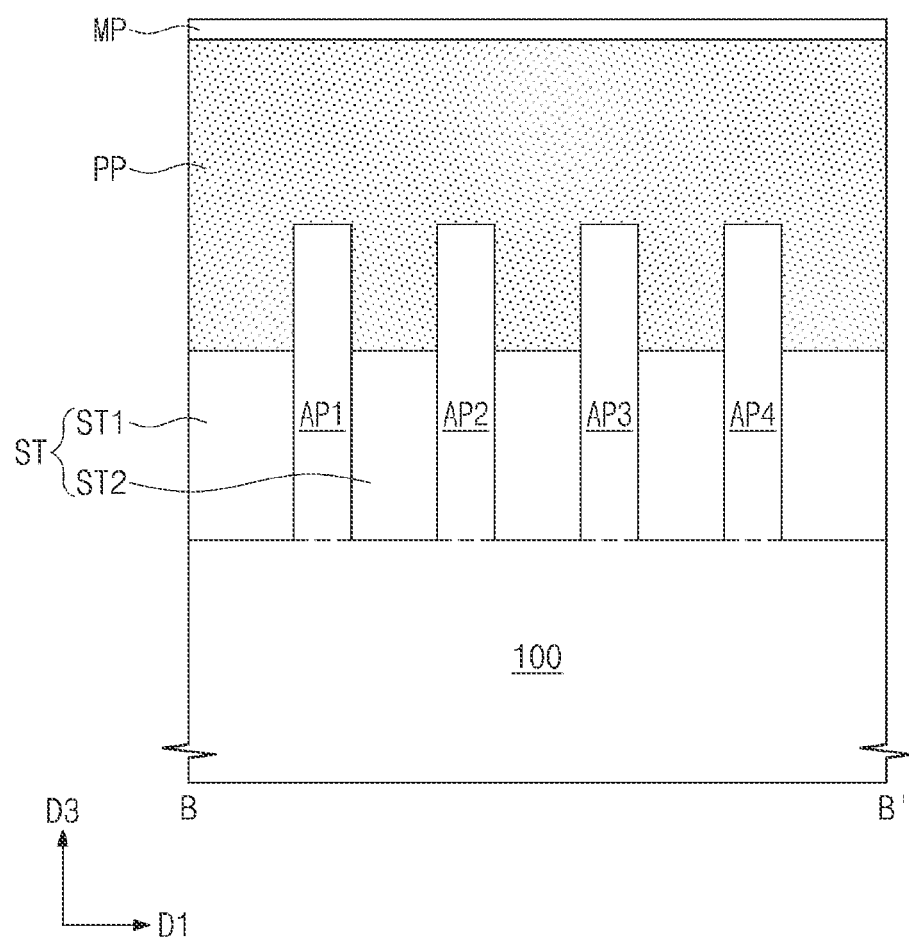
Figure 3D:
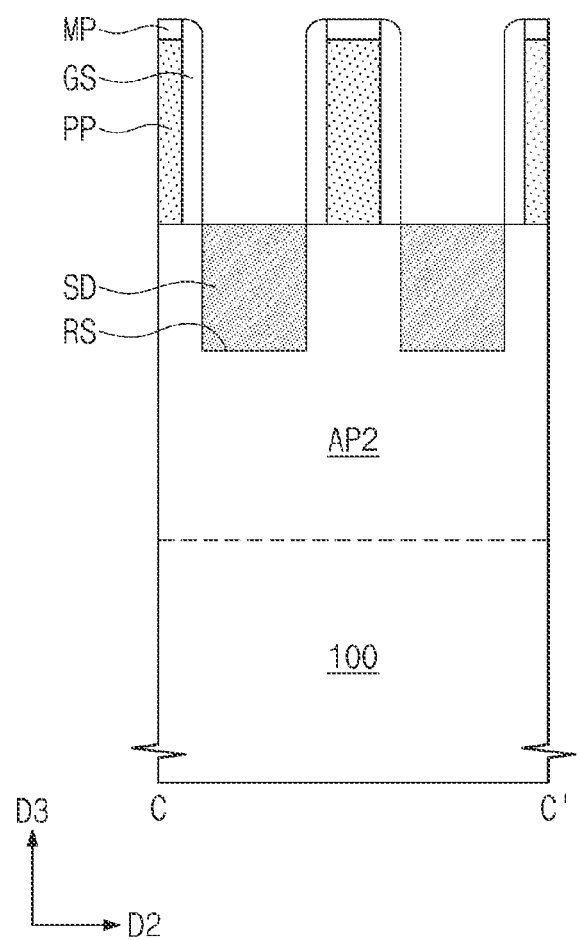
Figure 4A:
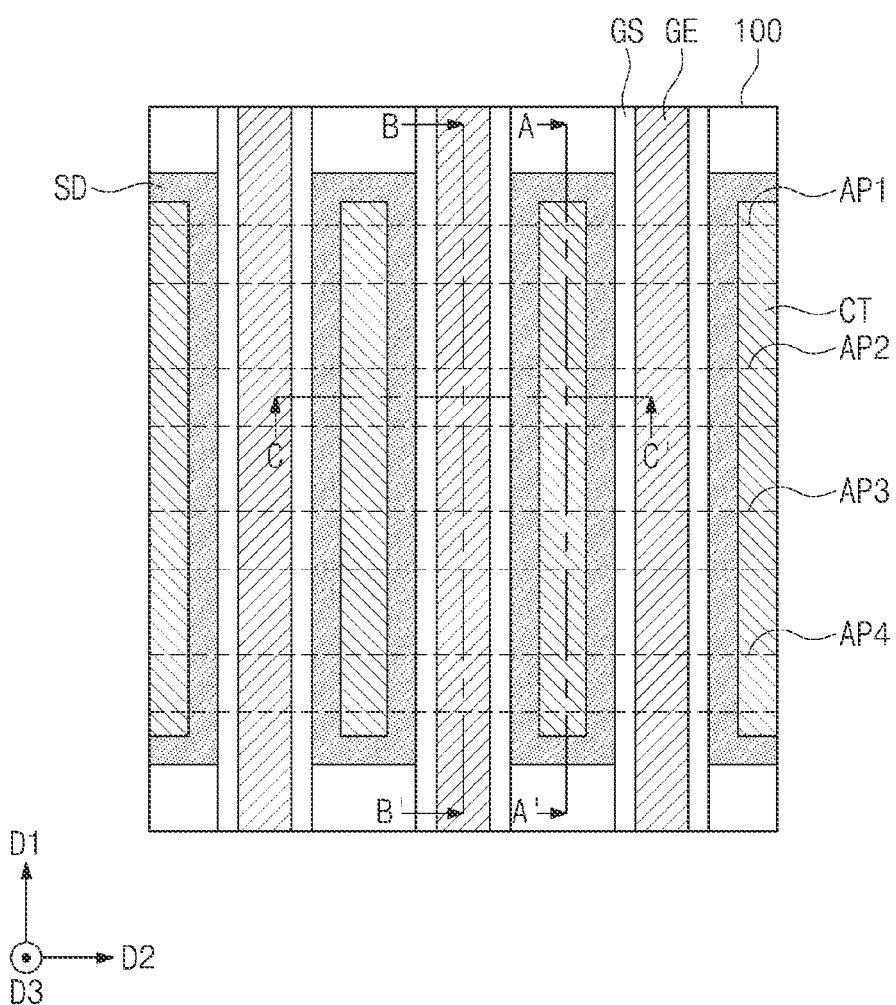
Figure 4B:
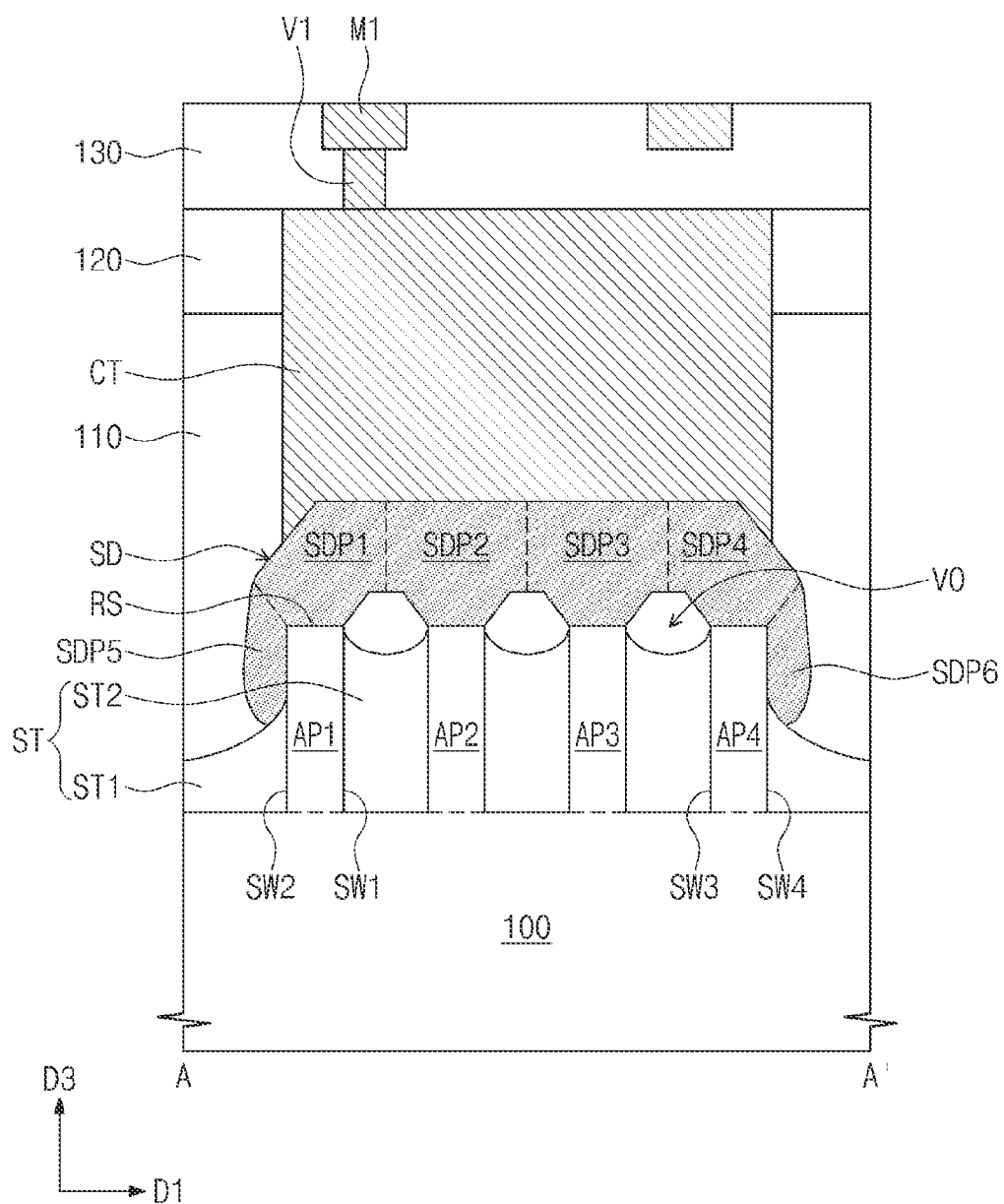
Figure 4C:
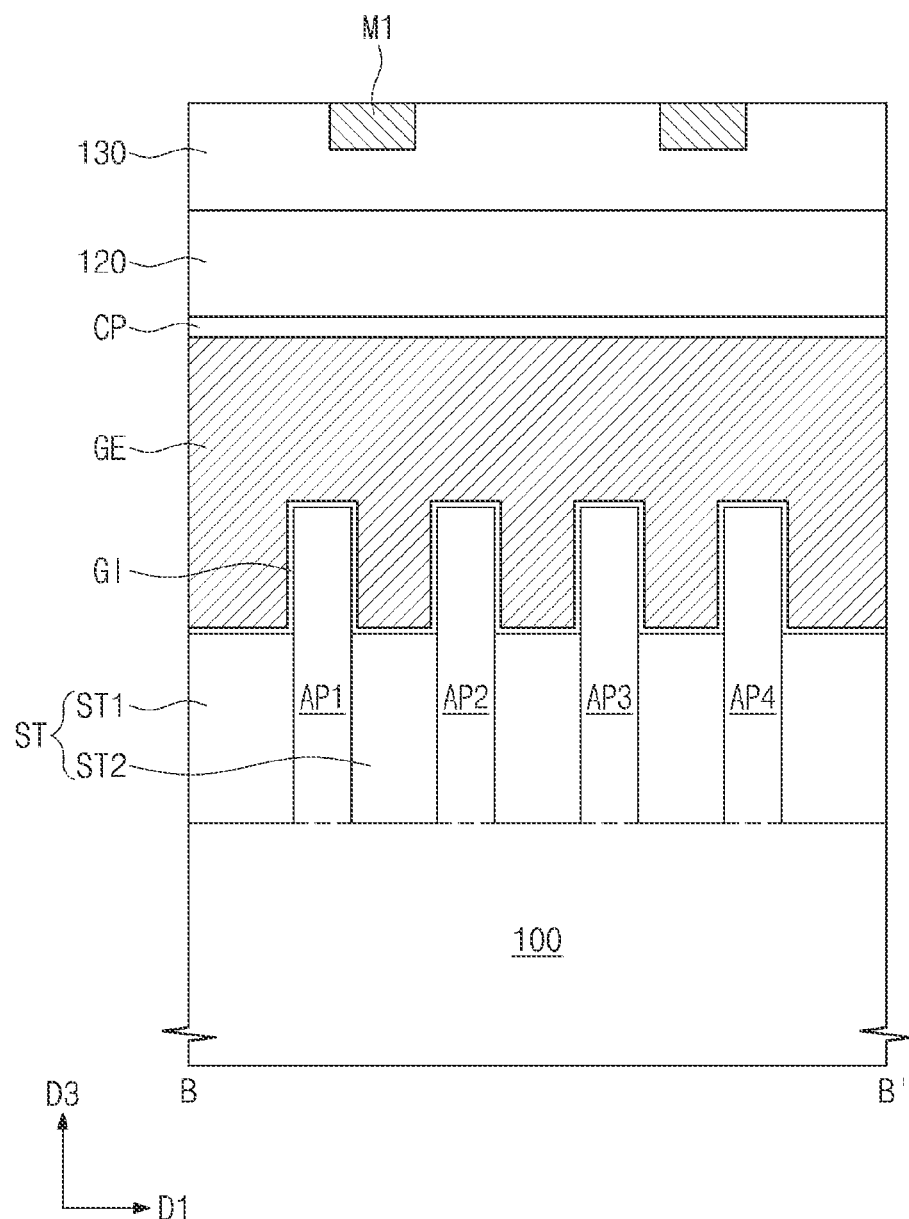
Figure 4D:
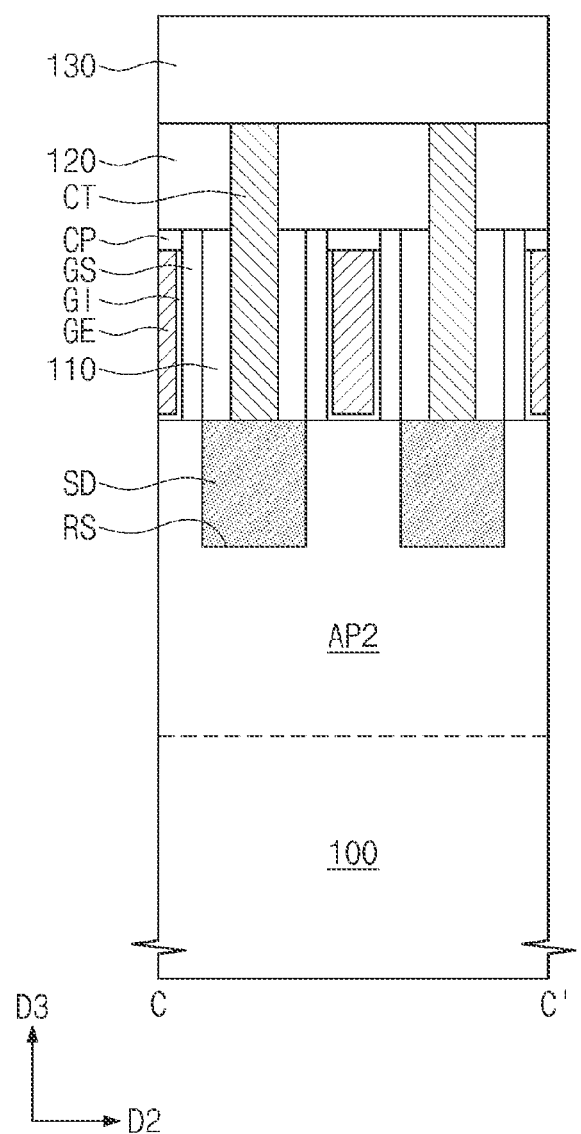

Each of the source/drain patterns SD may include first to sixth parts SDP1 to SDP6, as best seen in FIG. 3B. The first part SDP1 may be formed on the first active pattern AP1, the second part SDP2 may be formed on the second active pattern AP2, the third part SDP3 may be formed on the third active pattern AP3, and the fourth part SDP4 may be formed on the fourth active pattern AP4. The first to fourth parts SDP1 to SDP4 may be formed on respective upper surfaces of the first to fourth active patterns AP1 to AP4. The first to fourth parts SDP1 to SDP4 may be connected to each other. For example, the first to fourth parts SDP1 to SDP4 may be merged with each other.

The fifth part SDP5 may be formed on the second sidewall SW2 of the first active pattern AP1. The fifth part SDP5 may extend from the first part SDP1 and along an upper portion of the second sidewall SW2. The fifth part SDP5 may have a bottom surface whose lowermost level is lower than a lowermost level of the top surface of each of the intermediate segments ST2 between the first to fourth active patterns AP1 to AP4 below the source/drain pattern SD. The lowermost level of the bottom surface of the fifth part SDP5 may be lower than an uppermost level of the top surface of the outer segment ST1 on the second sidewall SW2 of the first active pattern AP1 below the source/drain pattern SD. The fifth part SDP5 may partially cover the top surface of the outer segment ST1 on the second sidewall SW2 of the first active pattern AP1. The top surfaces of the first to fourth active patterns AP1 to AP4 below the source/drain pattern SD may be located at a first level LV1. The lowermost level of the bottom surface of the fifth part SDP5 may be lower than the first level LV1.

The sixth part SDP6 may be formed on the fourth sidewall SW4 of the fourth active pattern AP4. The sixth part SDP6 may extend from the fourth part SDP4 and along an upper portion the fourth sidewall SW4. The sixth part SDP6 may have a bottom surface whose lowermost level is lower than the lowermost level of the top surface of each of the intermediate segments ST2 between the first to fourth active patterns AP1 to AP4 below the source/drain pattern SD. The lowermost level of the bottom surface of the sixth part SDP6 may be lower than an uppermost level of the top surface of the outer segment ST1 on the fourth sidewall SW4 of the fourth active pattern AP4 below the source/drain pattern SD. The sixth part SDP6 may partially cover a top surface of the outer segment ST1 on the fourth sidewall SW4 of the fourth active pattern AP4. The lowermost level of the bottom surface of the sixth part SDP6 may be lower than the first level LV1. In some embodiments, the source/drain pattern SD may differ from that shown, and may include one, or only one, of the fifth and sixth parts SDP5 and SDP6.

Voids VO may be formed between the source/drain pattern SD and the intermediate segments ST2 of the device isolation layer ST. For example, a void VO may be formed between the third active pattern AP3 and the fourth active pattern AP4, above the intermediate segment ST2 between the third active pattern AP3 and the fourth active pattern AP4, and below the source/drain pattern SD (and more specifically, below a portion of the third part SDP3 and below a portion of the fourth part SDP4). The voids VO may be substantially empty spaces. The voids VO may be filled with air.

Referring to FIGS. 4A to 4D, a first interlayer dielectric layer 110 may be formed on the substrate 100. A planarization process may be performed on the first interlayer dielectric layer 110 until top surfaces of the sacrificial patterns PP are exposed. The planarization process may include an etch-back process and/or a chemical mechanical polishing (CMP) process. When the first interlayer dielectric layer 110 is planarized, the mask patterns MP may be removed. The first interlayer dielectric layer 110 may include, for example, a silicon oxide layer or a silicon oxynitride layer.

The planarization process may remove the exposed sacrificial patterns PP. The removal of the sacrificial patterns PP may form empty spaces each of which is provided between a pair of neighboring gate spacers GS. The empty spaces may expose the first to fourth active patterns AP1 to AP4.

A gate dielectric pattern GI and a gate electrode GE may be formed in each of the empty spaces. The formation of the gate dielectric pattern GI and the gate electrode GE may include forming a gate dielectric layer on surfaces in the empty space, partially filling the empty space, and forming a gate electrode layer to completely fill the empty space. The filling of the empty space with the gate electrode layer may form the gate electrode GE. The gate dielectric layer may include a high-k dielectric material. The high-k dielectric material may include, for example, one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. The gate electrode layer may include, for example, one or more of conductive metal nitride (e.g., titanium nitride or tantalum nitride) and metal (e.g., titanium, tantalum, tungsten, copper, or aluminum).

Gate capping patterns CP may be formed on the gate electrodes GE. The gate capping pattern CP may include a material having an etch selectivity with respect to the first interlayer dielectric layer 110. The gate capping patterns CP may include, for example, one or more of SiON, SiCN, SiCON, and SiN.

A second interlayer dielectric layer 120 may be formed on the first interlayer dielectric layer 110 and the gate capping patterns CP. The second interlayer dielectric layer 120 may include, for example, a silicon oxide layer or a silicon oxynitride layer.

Contacts CT may be formed to penetrate the first and second interlayer dielectric layers 110 and 120 and to come into connection with the source/drain patterns SD. For example, the contacts CT may include metal, such as titanium, tantalum, tungsten, copper, or aluminum.

A third interlayer dielectric layer 130 may be formed on the second interlayer dielectric layer 120 and the contacts CT. The third interlayer dielectric layer 130 may include, for example, a silicon oxide layer or a silicon oxynitride layer.

Via contacts V1 and wiring lines M1 may be formed in the third interlayer dielectric layer 130. The via contact V1 may electrically connect the wiring line M1 and the contact CT to each other. Each of the via contact V1 and the wiring line M1 may include metal whose resistance is low. The low resistance metal may be or include, for example, copper or tungsten. The wiring line M1 may be provided on the via contact V1. The wiring line M1 may extend in the second direction D2. The wiring lines M1 may be spaced apart from each other in the first direction D1.

A semiconductor device according to some example embodiments of the present inventive concepts will now be described, with reference to FIGS. 4A to 4D.

The device isolation layer ST may be provided on the substrate 100. The device isolation layer ST may define the first to fourth active patterns AP1 to AP4 on an upper portion of the substrate 100. The device isolation layer ST may have a top surface lower than those of the first to fourth active patterns AP1 to AP4.

The first to fourth active patterns AP1 to AP4 may be sequentially arranged along the first direction D1. Each of the first to fourth active patterns AP1 to AP4 may extend in the second direction D2. The recesses RS may be correspondingly provided on the first to fourth active patterns AP1 to AP4.

The device isolation layer ST may include the outer segments ST1 and the intermediate segments ST2. The outer segment ST1 of the device isolation layer ST may have a top surface at a level lower than that of a top surface of the intermediate segment ST2 of the device isolation layer ST. The top surface of the outer segment ST1 on the second sidewall SW2 of the first active pattern AP1 may become lower with increasing distance from the first active pattern AP1. The top surface of the outer segment ST1 on the fourth sidewall SW4 of the fourth active pattern AP4 may become lower with increasing distance from the fourth active pattern AP4.

The source/drain patterns SD may be provided on the first to fourth active patterns AP1 to AP4. The source/drain patterns SD may fill the recesses RS. Each of the source/drain patterns SD may include the first to sixth parts SDP1 to SDP6. The first to fourth parts SDP1 to SDP4 may be merged with each other. The fifth part SDP5 may extend from the first part SDP1 and along the second sidewall SW2 of the first active pattern AP1. The sixth part SDP6 may extend from the fourth part SDP4 and along the fourth sidewall SW4 of the fourth active pattern AP4.

The gate electrodes GE may extend in the first direction D1, while running across the first to fourth active patterns AP1 to AP4. The gate electrodes GE may be spaced apart from each other in the second direction D2. For example, the gate electrode GE may include one or more of conductive metal nitride (e.g., titanium nitride or tantalum nitride) and metal (e.g., titanium, tantalum, tungsten, copper, or aluminum).

A pair of gate spacers GS may be on opposite sidewalls of each of the gate electrodes GE. The gate spacers GS may extend in the first direction D1 along the gate electrode GE. The gate spacers GS may have top surfaces higher than that of the gate electrode GE. The top surfaces of the gate spacers GS may be coplanar with that of the first interlayer dielectric layer 110.

The gate dielectric pattern GI may be interposed between each of the gate electrodes GE and each of the first to fourth active patterns AP1 to AP4. The gate dielectric pattern GI may lie between the gate electrode GE and each of the gate spacers GS. The gate dielectric pattern GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate capping pattern CP may be provided on each of the gate electrodes GE. The gate capping pattern CP may extend in the first direction D1 along the gate electrode GE.

The first interlayer dielectric layer 110 may be provided on an entire surface of the substrate 100. The first interlayer dielectric layer 110 may cover the device isolation layer ST, the gate electrodes GE, and the source/drain patterns SD. The first interlayer dielectric layer 110 may have a top surface substantially coplanar with those of the gate capping patterns CP. The second interlayer dielectric layer 120 may be provided on the first interlayer dielectric layer 110.

The contacts CT may extend at least partially into the first and second interlayer dielectric layers 110 and 120 and come into connection with the source/drain patterns SD.

The third interlayer dielectric layer 130 may be provided on the second interlayer dielectric layer 120 and the contacts CT. The via contacts V1 and the wiring lines M1 may be provided in the third interlayer dielectric layer 130.

Figure 5:
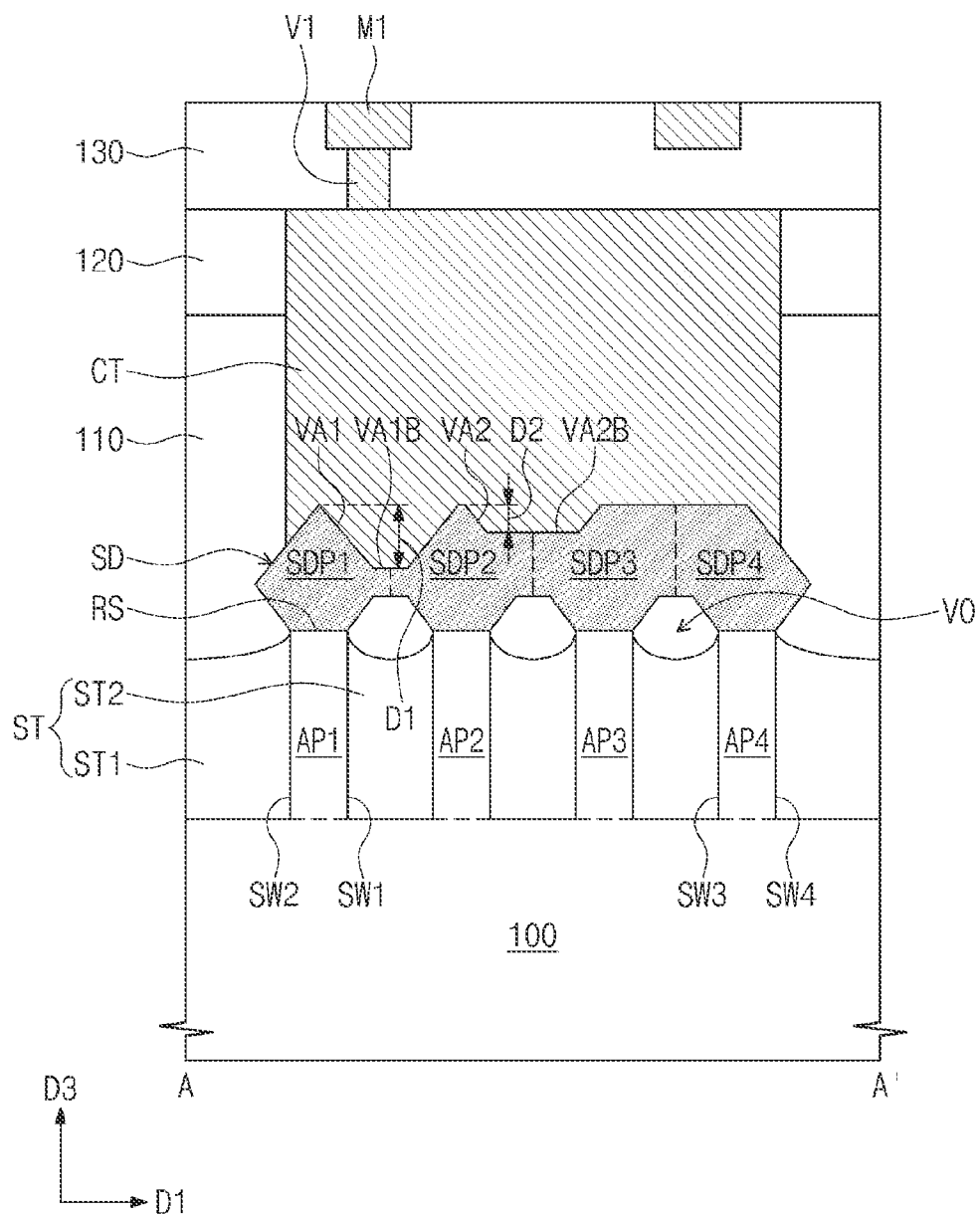
FIG. 5 illustrates a cross-sectional view taken along line A-A' of FIG. 4A.

A semiconductor device according to some example embodiments of the present inventive concepts will now be described, with reference to FIGS. 4A, 4C, 4D, and 5. FIG. 5 illustrates a cross-sectional view taken along line A-A' of FIG. 4A of a semiconductor device according to an example of an embodiment. For brevity of description, components substantially the same as those discussed with reference to FIGS. 4A to 4D are allocated the same reference numerals thereto, and repetitive explanations thereof may be omitted in favor of the description provided above.

The device isolation layer ST may be provided on the substrate 100. The device isolation layer ST may define the first to fourth active patterns AP1 to AP4 on an upper portion of the substrate 100. Each of the outer segments ST1 of the device isolation layer ST may have a top surface at a level substantially the same as or similar to that of a top surface of each of the intermediate segments ST2 of the device isolation layer ST. For example, the level of the top surface of each outer segment ST1 of FIG. 5 may be higher than the top surface of each outer segment ST1 of FIG. 2B. The recesses RS may be correspondingly provided on the first to fourth active patterns AP1 to AP4.

The source/drain patterns SD may be provided on the first to fourth active patterns AP1 to AP4. Each of the source/drain patterns SD may include the first to fourth parts SDP1 to SDP4. The first part SDP1 may be formed on the first active pattern AP1, the second part SDP2 may be formed on the second active pattern AP2, the third part SDP3 may be formed on the third active pattern AP3, and the fourth part SDP4 may be formed on the fourth active pattern AP4. The first to fourth parts SDP1 to SDP4 may be connected to each other. For example, the first to fourth parts SDP1 to SDP4 may be merged with each other. According to the present example embodiment, the source/drain patterns SD may not include the fifth and sixth parts SDP5 and SDP6 discussed above with reference to FIGS. 3A to 3D.

The first and second parts SDP1 and SDP2 may define a first valley VA1. For example, the first valley VA1 may be defined by top surfaces of the first and second parts SDP1 and SDP2. The first valley VA1 may cause the source/drain pattern SD to have a non-flat top surface that connects an uppermost portion of the first part SDP1 to an uppermost portion of the second part SDP2. The first valley VA1 may cause the source/drain pattern SD to have a non-flat top surface between an uppermost portion of the first part SDP1 and an uppermost portion of the second part SDP2. The first valley VA1 may be interposed between the first and second parts SDP1 and SDP2. The first valley VA1 may have a first depth D1. The first depth D1 may correspond to a height between a bottom VA1B of the first valley VA1 and the uppermost portion of the first part SDP1 and/or the second part SDP2. The bottom VA1B of the first valley VA1 may be located at a level lower than that of the uppermost portion of the first part SDP1 and that of the uppermost portion of the second part SDP2.

The second and third parts SDP2 and SDP3 may define a second valley VA2. For example, the second valley VA2 may be defined by top surfaces of the second and third parts SDP2 and SDP3. The second valley VA2 may cause the source/drain pattern SD to have a non-flat top surface that connects the uppermost portion of the second part SDP2 to an uppermost portion of the third part SDP3. The second valley VA2 may cause the source/drain pattern SD to have a non-flat top surface between the uppermost portion of the second part SDP2 and an uppermost portion of the third part SDP3. The second valley VA2 may be interposed between the second and third parts SDP2 and SDP3. The second valley VA2 may have a second depth D2. The second depth D2 may correspond to a height between a bottom VA2B of the second valley VA2 and the uppermost portion of the second part SDP2 and/or the third part SDP3. The second depth D2 may be less than the first depth D1. The bottom VA2B of the second valley VA2 may be located at a level lower than that of the uppermost portion of the second part SDP2 and that of the uppermost portion of the third part SDP3. The level of the bottom VA2B of the second valley VA2 may be higher than the level of the bottom VA1B of the first valley VA1.

The source/drain pattern SD may have a flat top surface that connects the uppermost portion of the third part SDP3 to an uppermost portion of the fourth part SDP4. For example, no valley may be formed between the third and fourth parts SDP3 and SDP4.

The gate electrodes GE may be provided to extend in the first direction D1, while running across the first to fourth active patterns AP1 to AP4. A pair of gate spacers GS may be on opposite sidewalls of each of the gate electrodes GE. The gate dielectric pattern GI may be interposed between each of the gate electrodes GE and each of the first to fourth active patterns AP1 to AP4. The gate dielectric pattern GI may lie between the gate electrode GE and each of the gate spacers GS. The gate capping pattern CP may be provided on each of the gate electrodes GE.

The first interlayer dielectric layer 110 may be provided on an entire surface of the substrate 100. The second interlayer dielectric layer 120 may be provided on the first interlayer dielectric layer 110.

The contacts CT may extend at least partially into the first and second interlayer dielectric layers 110 and 120 and to come into connection with the source/drain patterns SD.

The third interlayer dielectric layer 130 may be provided on the second interlayer dielectric layer 120 and the contacts CT. The via contacts V1 and the wiring lines M1 may be provided in the third interlayer dielectric layer 130.

FIGS. 6A, 7A, 8A, 9A, 10A, and 11A illustrate plan views showing a method of manufacturing a semiconductor device according to some example embodiments of the present inventive concepts. FIGS. 6B, 7B, 8B, 9B, 10B, and 11B illustrate cross-sectional views taken along line A-A' of FIGS. 6A, 7A, 8A, 9A, 10A, and 11A, respectively. FIGS. 7C, 8C, 9C, 10C, and 11C illustrate cross-sectional views taken along line B-B' of FIGS. 7A, 8A, 9A, 10A, and 11A, respectively. FIGS. 7D, 8D, 9D, 10D, and 11D illustrate cross-sectional views taken along line C-C' of FIGS. 7A, 8A, 9A, 10A, and 11A, respectively.

For brevity of description, components substantially the same as those discussed with reference to FIGS. 1A to 4D are allocated the same reference numerals thereto, and a repetitive explanation thereof may be omitted herein in favor of the explanation provided above.

Figure 6A:
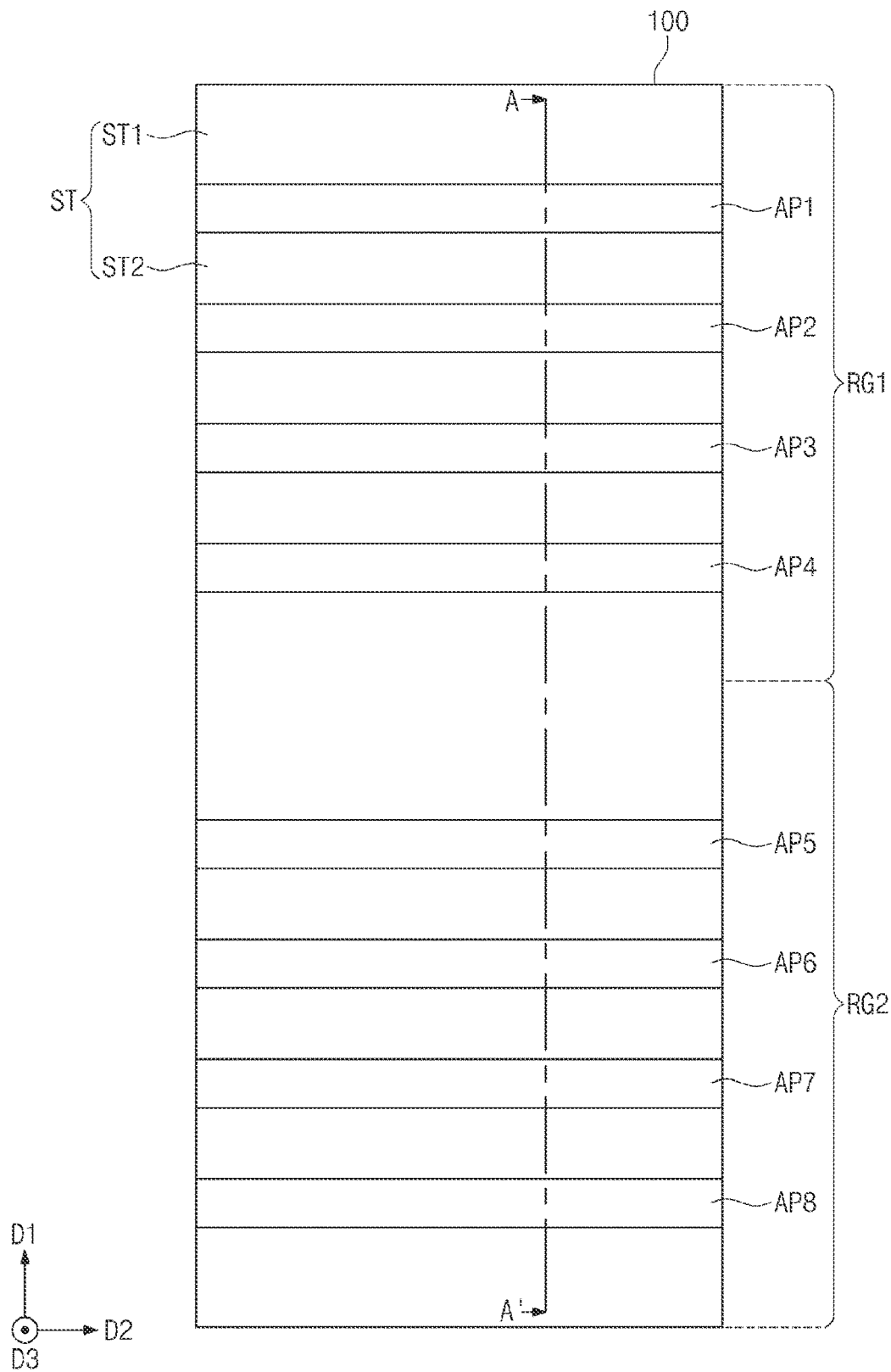
FIGS. 6A, 7A, 8A, 9A, 10A, and 11A illustrate plan views showing operations of methods of manufacturing semiconductor devices, according to some of the present inventive concepts.
Figure 7A:
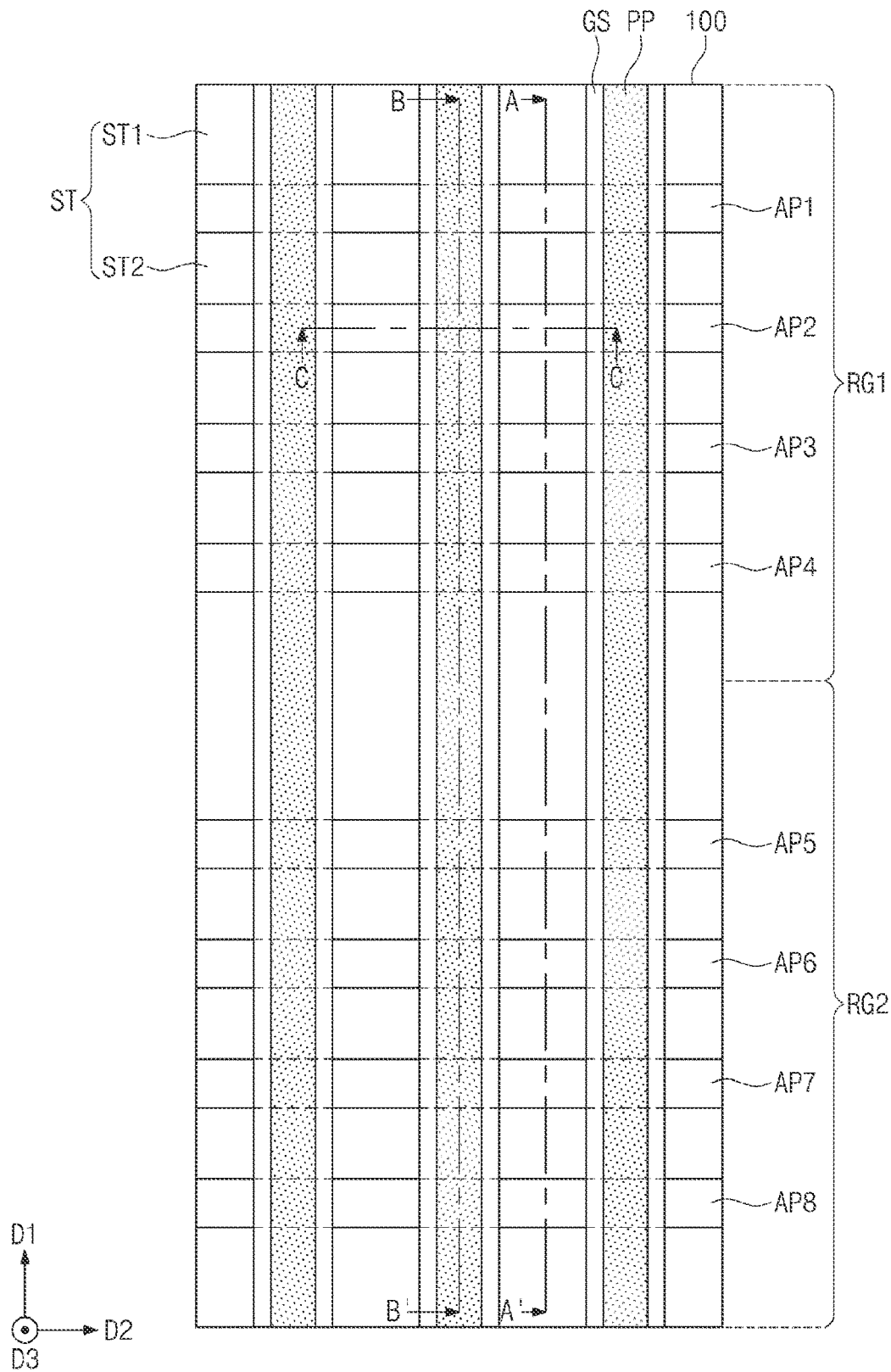
Figure 7B:
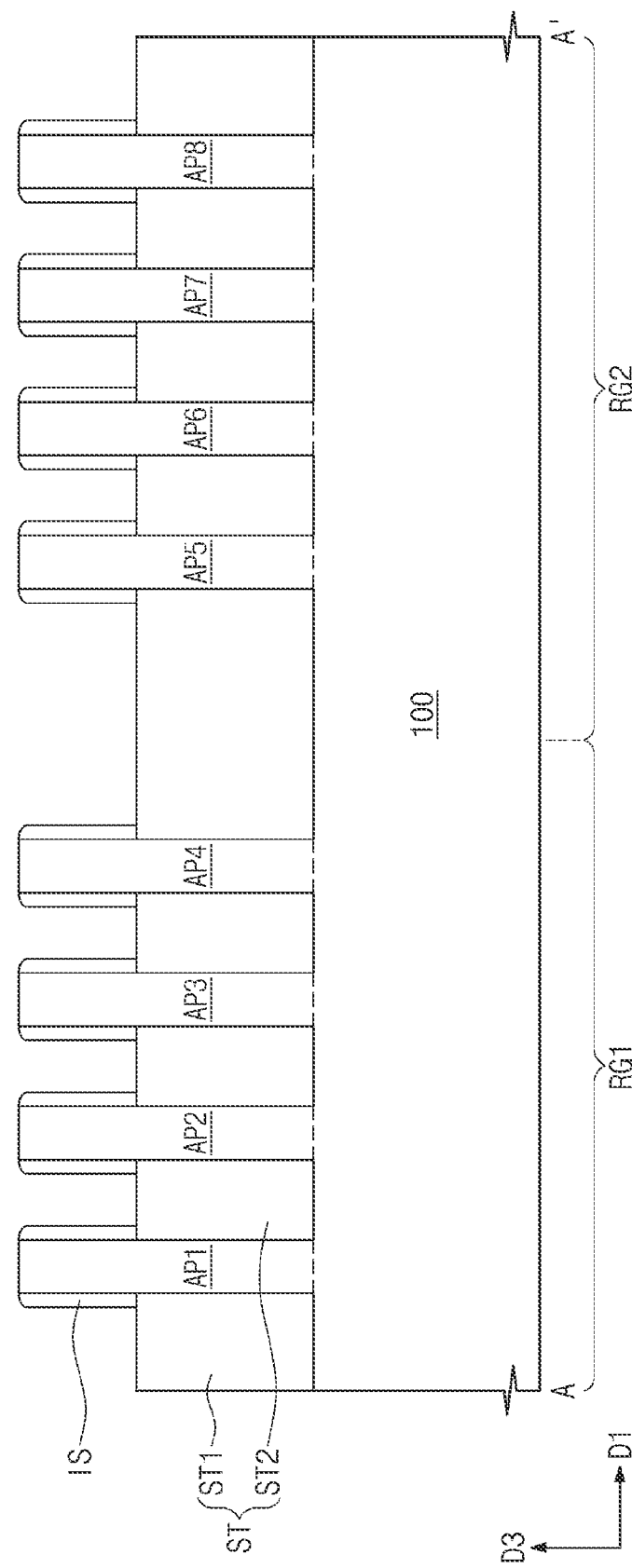
Figure 7C:
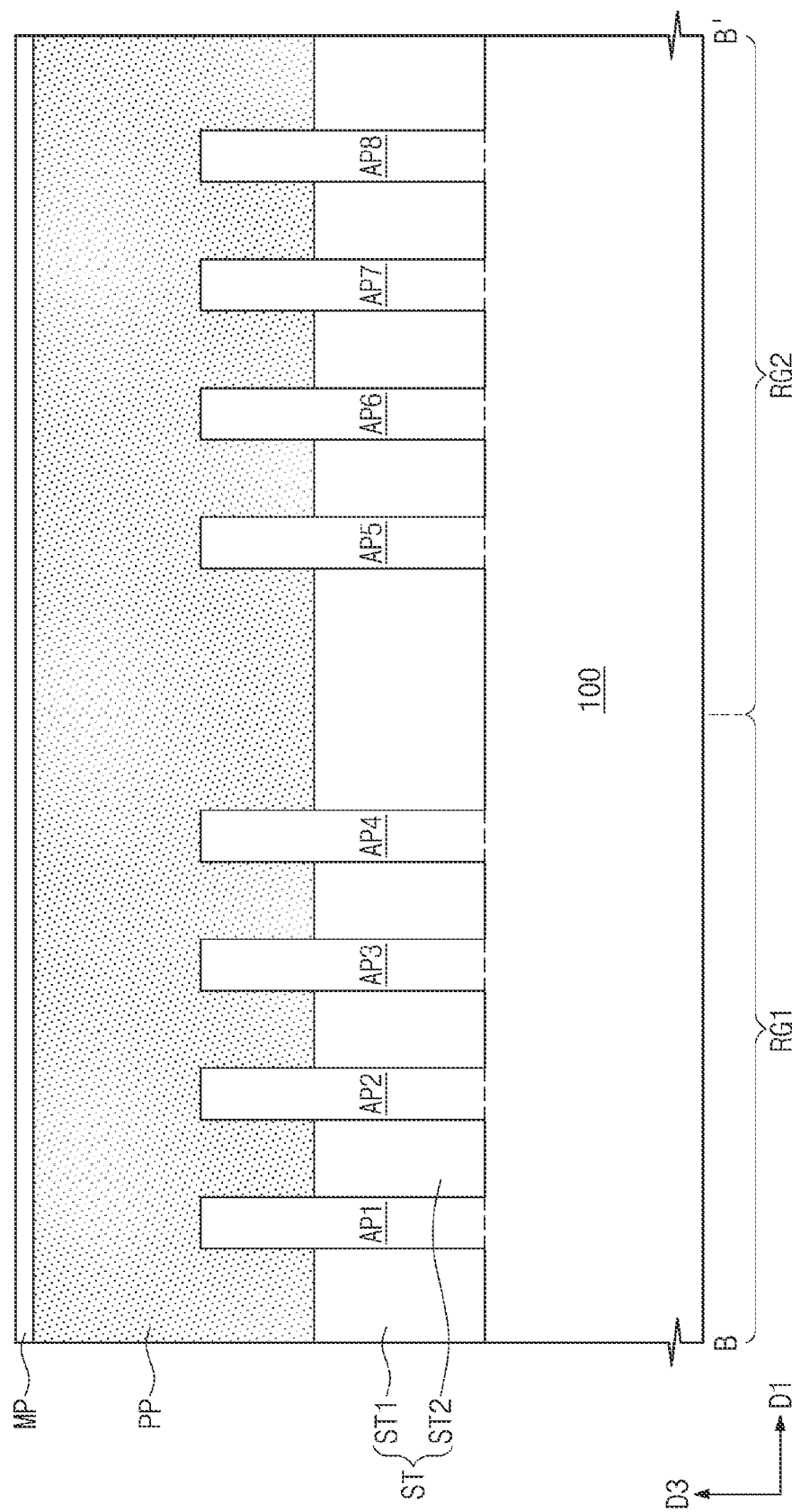
Figure 7D:
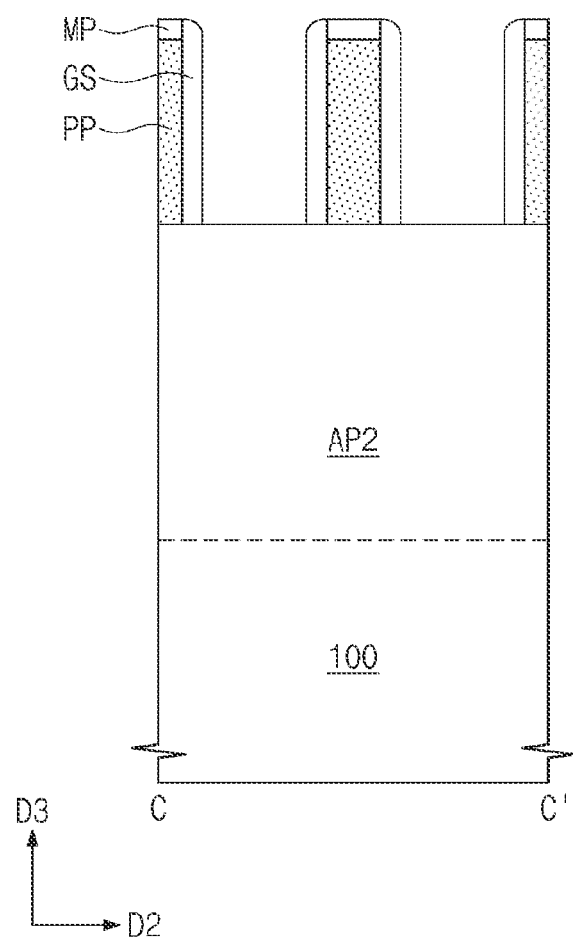
FIGS. 7D, 8D, 9D, 10D, and 11D illustrate cross-sectional views taken along line C-C' of FIGS. 7A, 8A, 9A, 10A, and 11A, respectively.

Referring to FIGS. 6A and 6B, a substrate 100 may be provided. The substrate 100 may include a first region RG1 and a second region RG2.

A device isolation layer ST may be formed on the substrate 100. The formation of the device isolation layer ST may include patterning the first and second regions RG1 and RG2 to form trenches that define first to fourth active patterns AP1 to AP4 on the first region RG1 and also define fifth to eighth active patterns AP5 to AP8 on the second region RG2, forming an insulation layer on an entire surface of the substrate 100, and then recessing the insulation layer. The device isolation layer ST may have a top surface lower than those of the first to eighth active patterns AP1 to AP8.

The device isolation layer ST may define the first to eighth active patterns AP1 to AP8 on an upper portion of the substrate 100. Each of the first to eighth active patterns AP1 to AP8 may have a linear or bar shape extending in a second direction D2.

The first to eighth active patterns AP1 to AP8 may be sequentially arranged along a first direction D1. The first to eighth active patterns AP1 to AP8 may be spaced apart from each other in the first direction D1.

Referring to FIGS. 7A to 7D, sacrificial patterns PP may be formed to run across the first to eighth active patterns AP1 to AP8. Each of the sacrificial patterns PP may be perpendicular to the first to eighth active patterns AP1 to AP8, when viewed in a plan view. The formation of the sacrificial patterns PP may include forming a sacrificial layer on the substrate 100, forming mask patterns MP on the sacrificial layer, and using the mask patterns MP as an etching mask to etch the sacrificial layer.

A pair of gate spacers GS may be formed on opposite sidewalls of each of the sacrificial patterns PP. A pair of insulation spacers IS may be formed on opposite sidewalls of each of the first to eighth active patterns AP1 to AP8. The gate spacers GS and the insulation spacers IS may be formed at the same time. The gate spacers GS and the insulation spacers IS may include the same material. For example, the gate spacers GS and the insulation spacers IS may each include one or more of SiCN, SiCON, and SiN. For another example, the gate spacers GS and the insulation spacers IS may each include a multiple layer consisting of two or more of SiCN, SiCON, and SiN.

The formation of the gate spacers GS and the insulation spacers IS may include performing a deposition process, such as CVD or ALD, to form a spacer layer on the entire surface of the substrate 100, and performing an anisotropic etching process on the spacer layer.

Figure 8A:
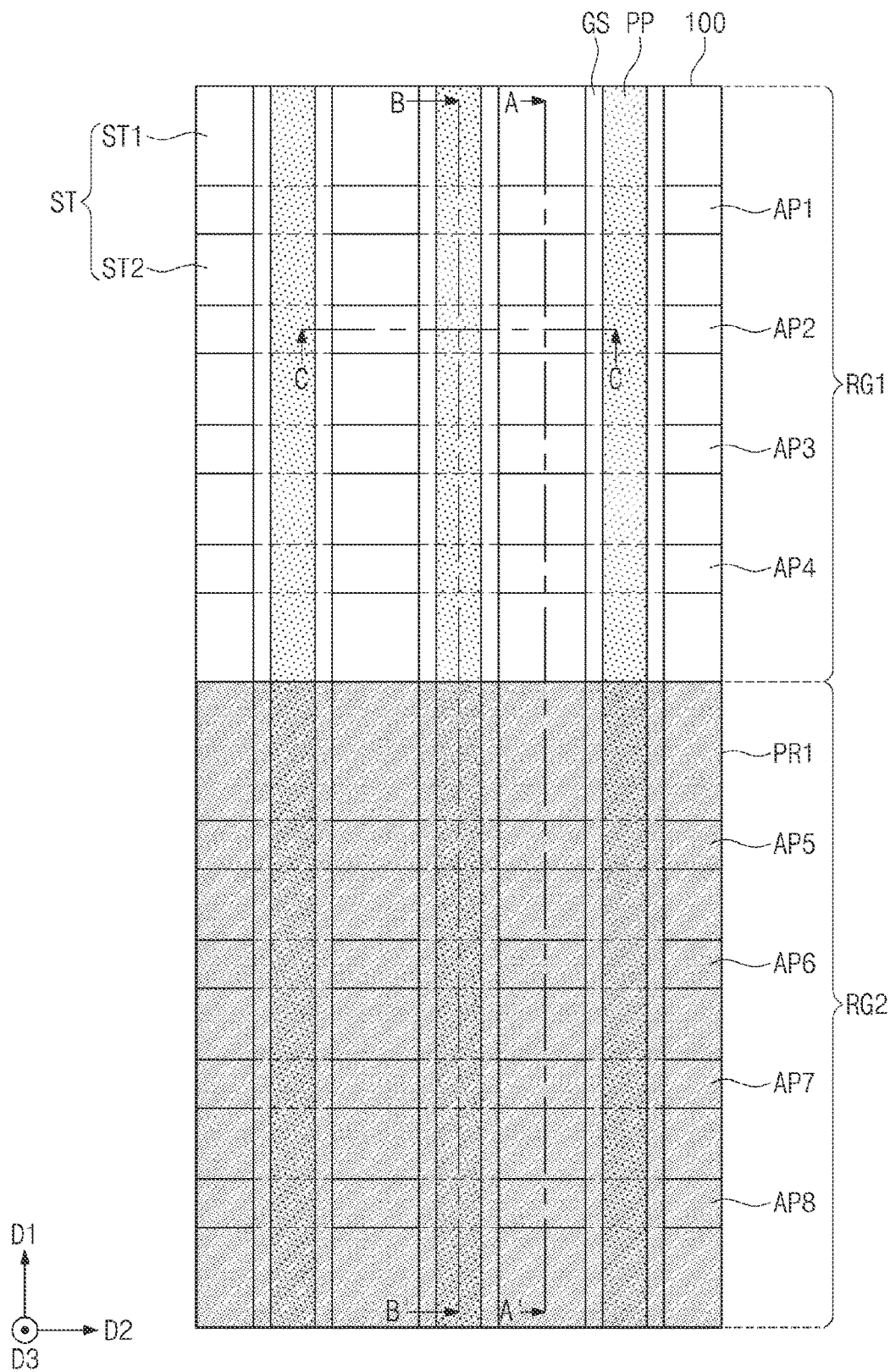
Figure 8B:
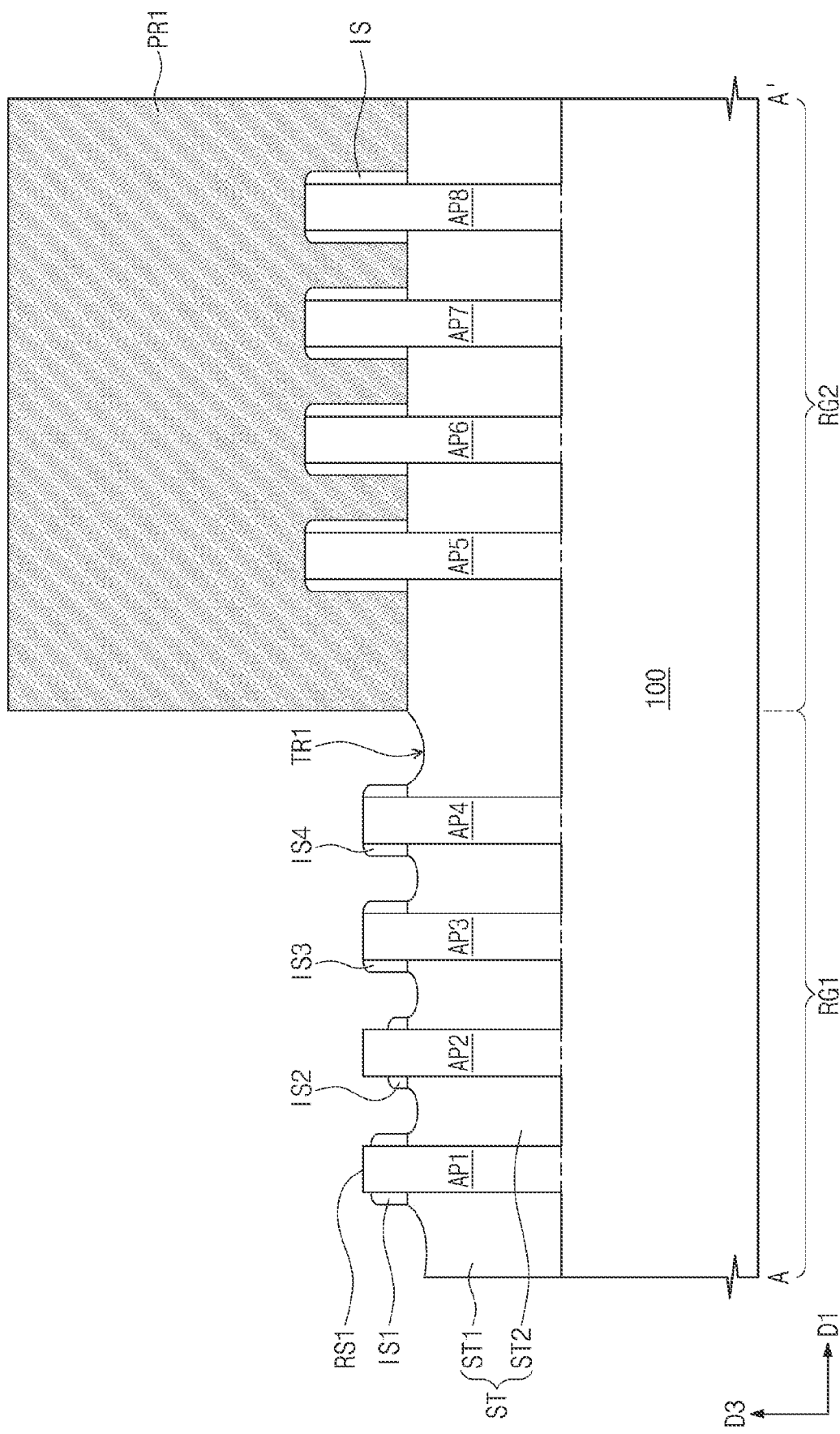
Figure 8D:
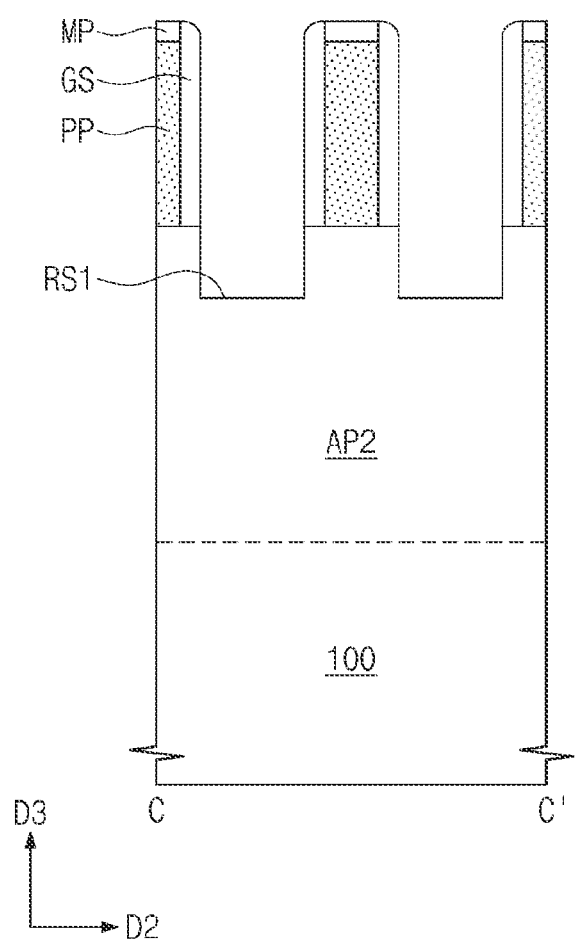

Referring to FIGS. 8A to 8D, the first to fourth active patterns AP1 to AP4 on the first region RG1 of the substrate 100 may be etched to form first recesses RS1. The first recesses RS1 are best seen in FIG. 8D. The etching of the first to fourth active patterns AP1 to AP4 may include coating a first photoresist layer on the entire surface of the substrate 100, patterning the first photoresist layer by a first photolithography process to form a first photoresist pattern PR1, and using the first photoresist pattern PR1 as an etching mask to etch the first to fourth active patterns AP1 to AP4.

The insulation spacers IS may include first to fourth insulation spacers IS1 to IS4. The first to fourth insulation spacers IS1 to IS4 may be formed on opposite sidewalls of the first to fourth active patterns AP1 to AP4, respectively.

When the first to fourth active patterns AP1 to AP4 are etched, the first to fourth insulation spacers IS1 to IS4 may also be etched. The first to fourth insulation spacers IS1 to IS4 may have different etching degrees from each other. In such cases, the first to fourth insulation spacers IS1 to IS4 may have different maximum heights from each other. For example, the maximum heights of the first insulation spacers IS1 on the opposite sidewalls of the first active pattern AP1 may be greater than the maximum heights of the second insulation spacers IS2 on the opposite sidewalls of the second active pattern AP2. The maximum heights of the third insulation spacers IS3 on the opposite sidewalls of the third active pattern AP3 may be greater than the maximum heights of the first insulation spacers IS1. The first insulation spacers IS1 may partially expose the sidewalls of the first active pattern AP1. The second insulation spacers IS2 may partially expose the sidewalls of the second active pattern AP2.

A first trench TR1 may be formed at the same time when the first to fourth active patterns AP1 to AP4 are etched. The first trench TR1 may be formed by etching the device isolation layer ST between the fourth and fifth active patterns AP4 and AP5. For example, a portion of the device isolation layer ST that is adjacent to the fourth active pattern AP4 may be etched, which may result in the formation of the first trench TR1. The first trench TR1 may extend in the second direction D2.

Referring to FIGS. 9A to 9D, the fifth to eighth active patterns AP5 to AP8 on the second region RG2 of the substrate 100 may be etched to form second recesses RS2. The etching of the fifth to eighth active patterns AP5 to AP8 may include coating a second photoresist layer on the entire surface of the substrate 100, patterning the second photoresist layer by a second photolithography process to form a second photoresist pattern PR2, and using the second photoresist pattern PR2 as an etching mask to etch the fifth to eighth active patterns AP5 to AP8.

The insulation spacers IS may include fifth to eighth insulation spacers IS5 to IS8. The fifth to eighth insulation spacers IS5 to IS8 may be formed on opposite sidewalls of the fifth to eighth active patterns AP5 to AP8, respectively.

When the fifth to eighth active patterns AP5 to AP8 are etched, the fifth to eighth insulation spacers IS5 to IS8 may also be etched. The fifth to eighth insulation spacers IS5 to IS8 may have different etching degrees from each other. In such cases, the fifth to eighth insulation spacers IS5 to IS8 may have different maximum heights from each other. For example, the maximum heights of the fifth insulation spacers IS5 on the opposite sidewalls of the fifth active pattern AP5 may be greater than the maximum heights of the sixth insulation spacers IS6 on the opposite sidewalls of the sixth active pattern AP6. The maximum heights of the seventh insulation spacers IS7 on the opposite sidewalls of the seventh active pattern AP7 may be greater than the maximum heights of the fifth insulation spacers IS5. The fifth insulation spacers IS5 may partially expose the sidewalls of the fifth active pattern AP5. The sixth insulation spacers IS6 may partially expose the sidewalls of the sixth active pattern AP6.

A second trench TR2 may be formed at the same time when the fifth to eighth active patterns AP5 to AP8 are formed. The second trench TR2 may be formed by etching the device isolation layer ST between the first trench TR1 and the fifth active pattern AP5. For example, a portion of the device isolation layer ST that is adjacent to the fifth active pattern AP5 may be etched, which may result in the formation of the second trench TR2. The second trench TR2 may extend in the second direction D2.

Figure 9A:
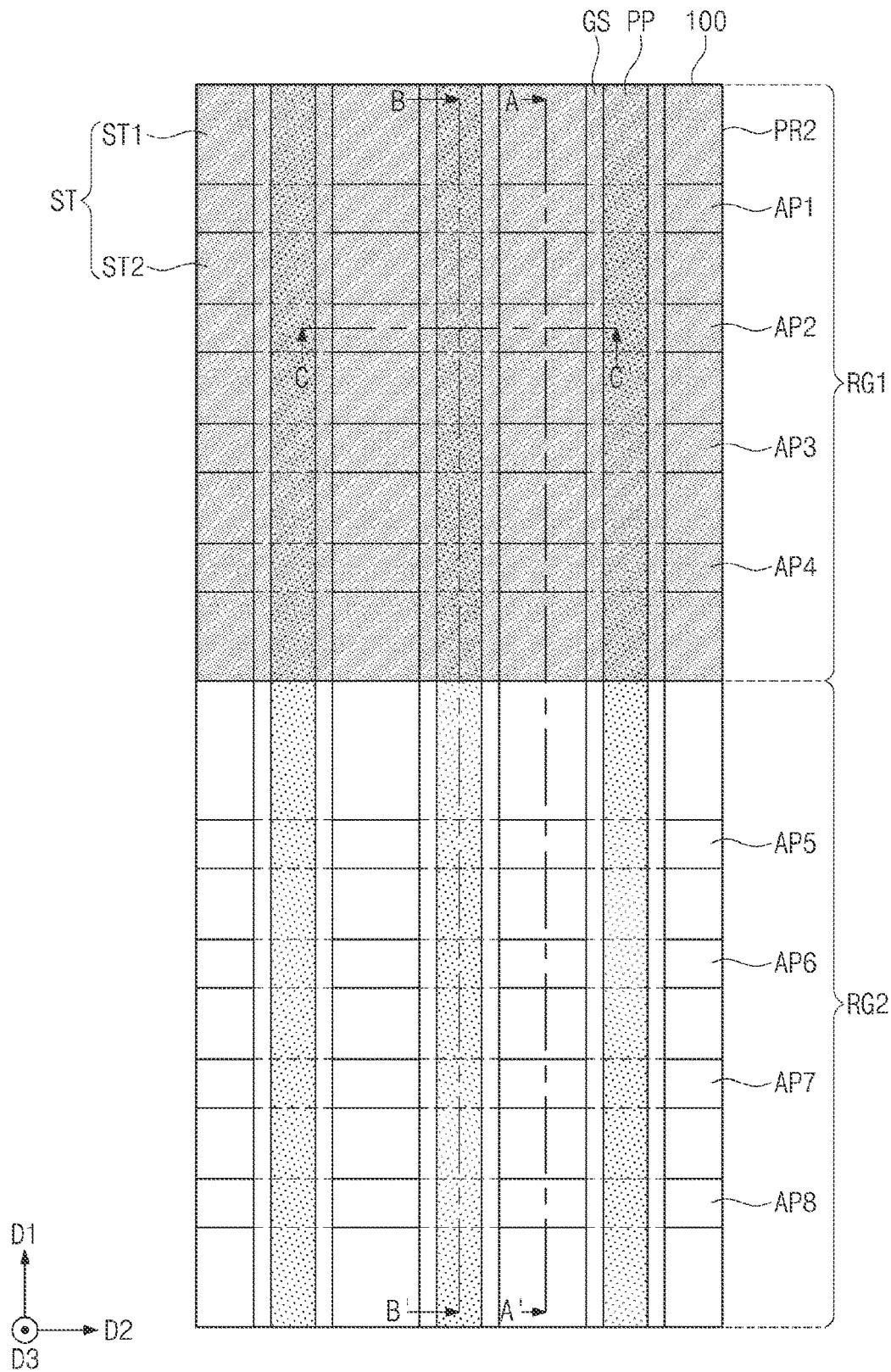
Figure 9B:
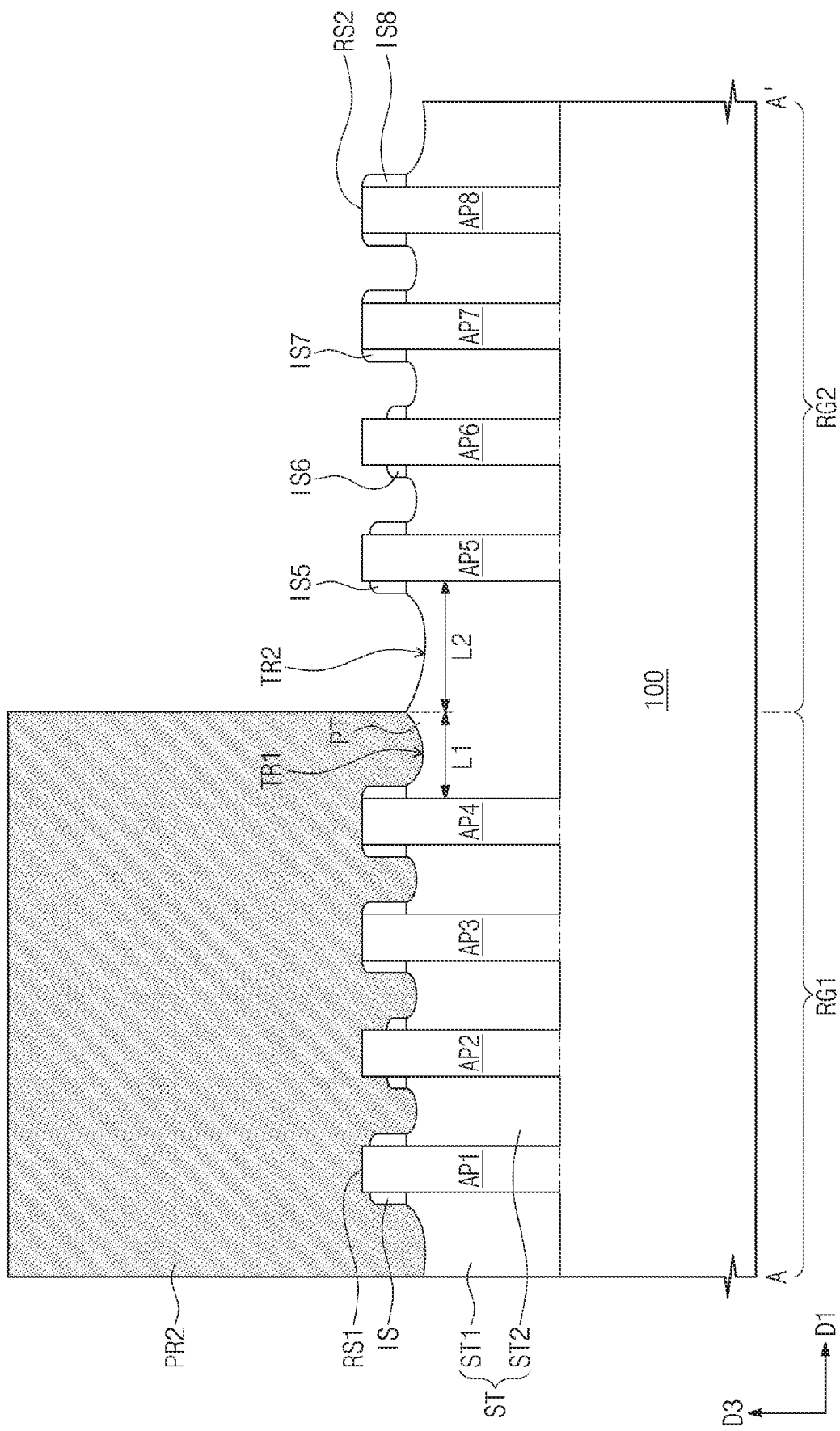
Figure 9D:
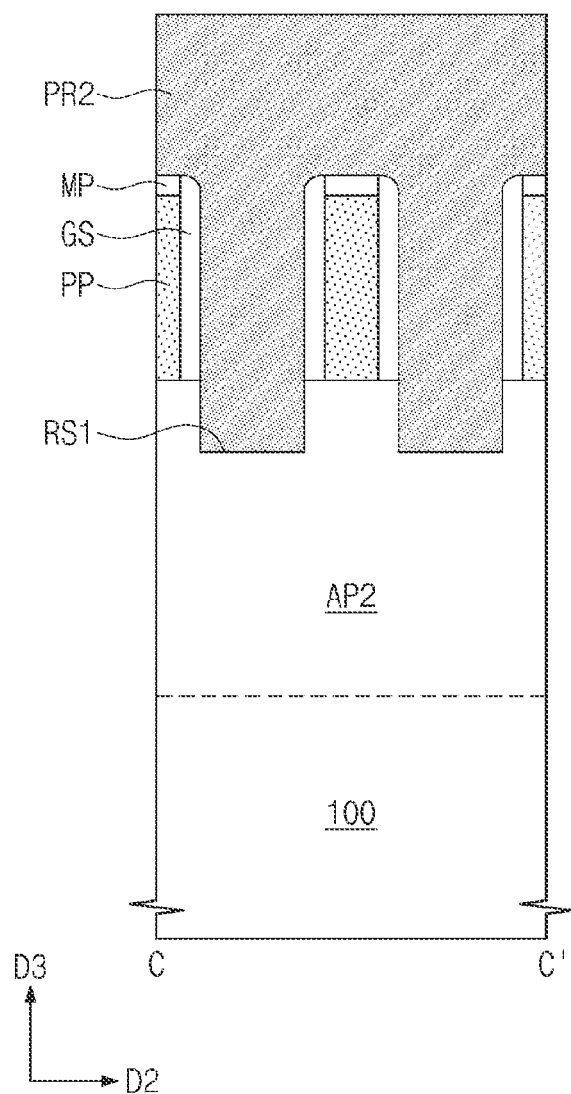
Figure 10A:
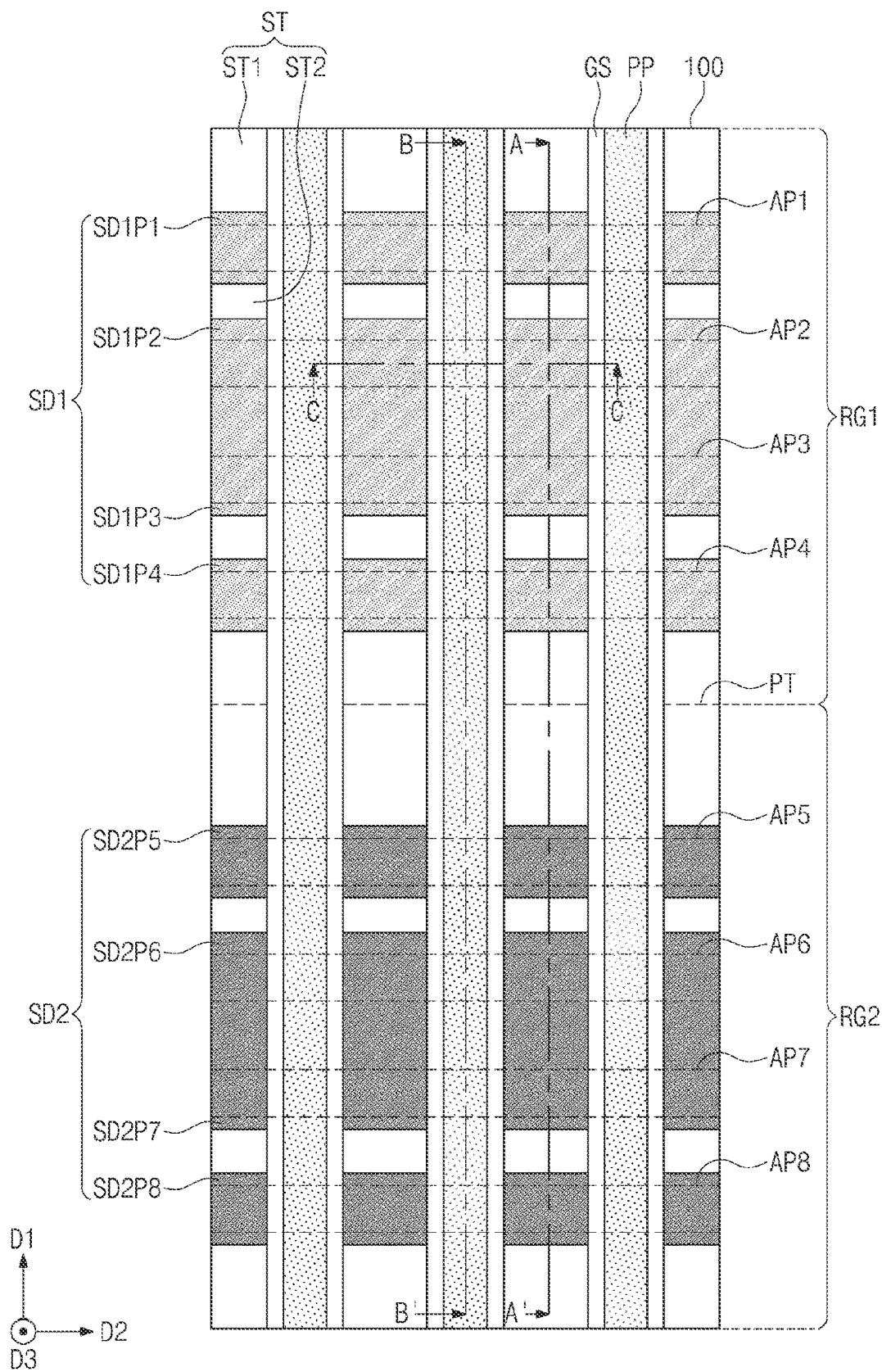
Figure 10B:
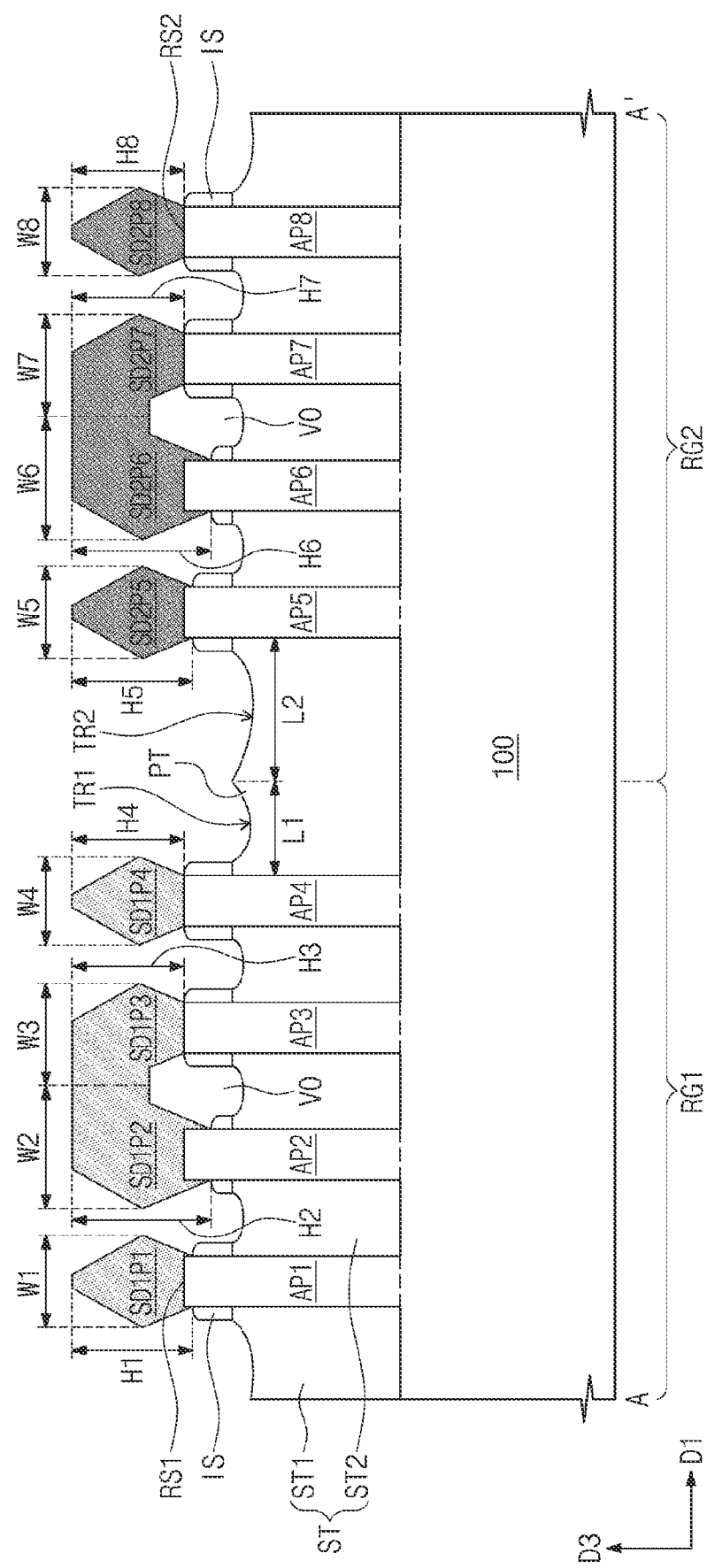
Figure 10C:
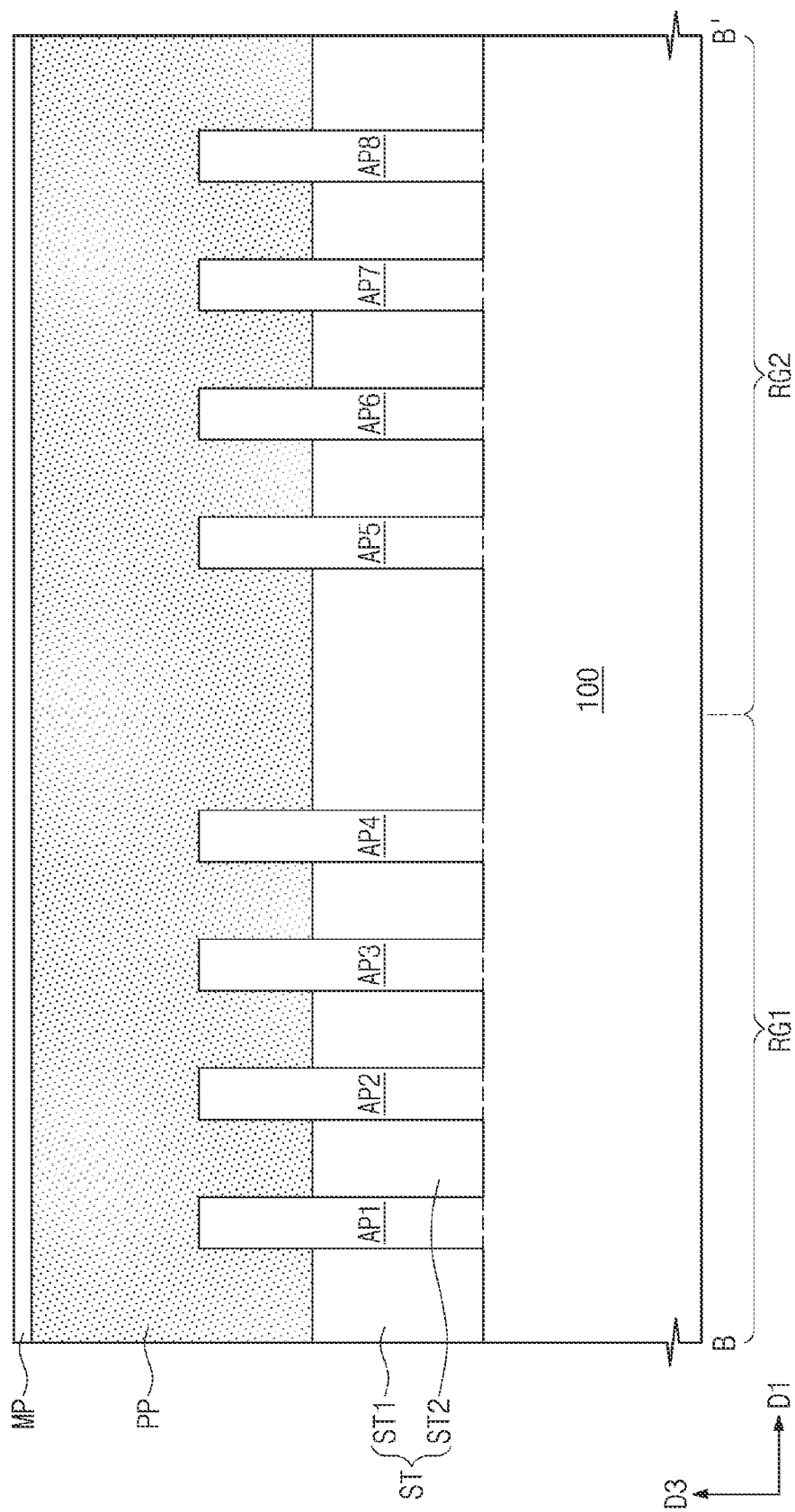
Figure 10D:
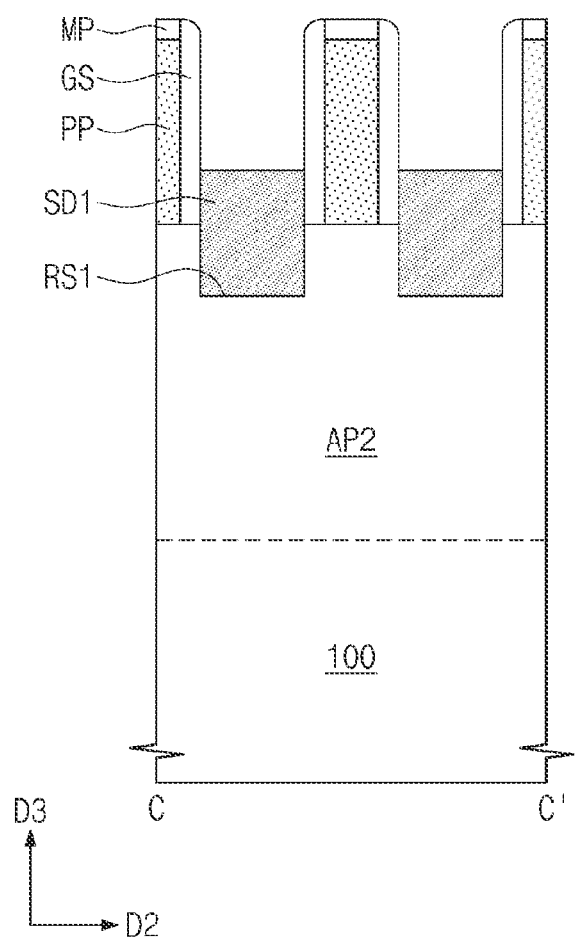
Figure 11A:
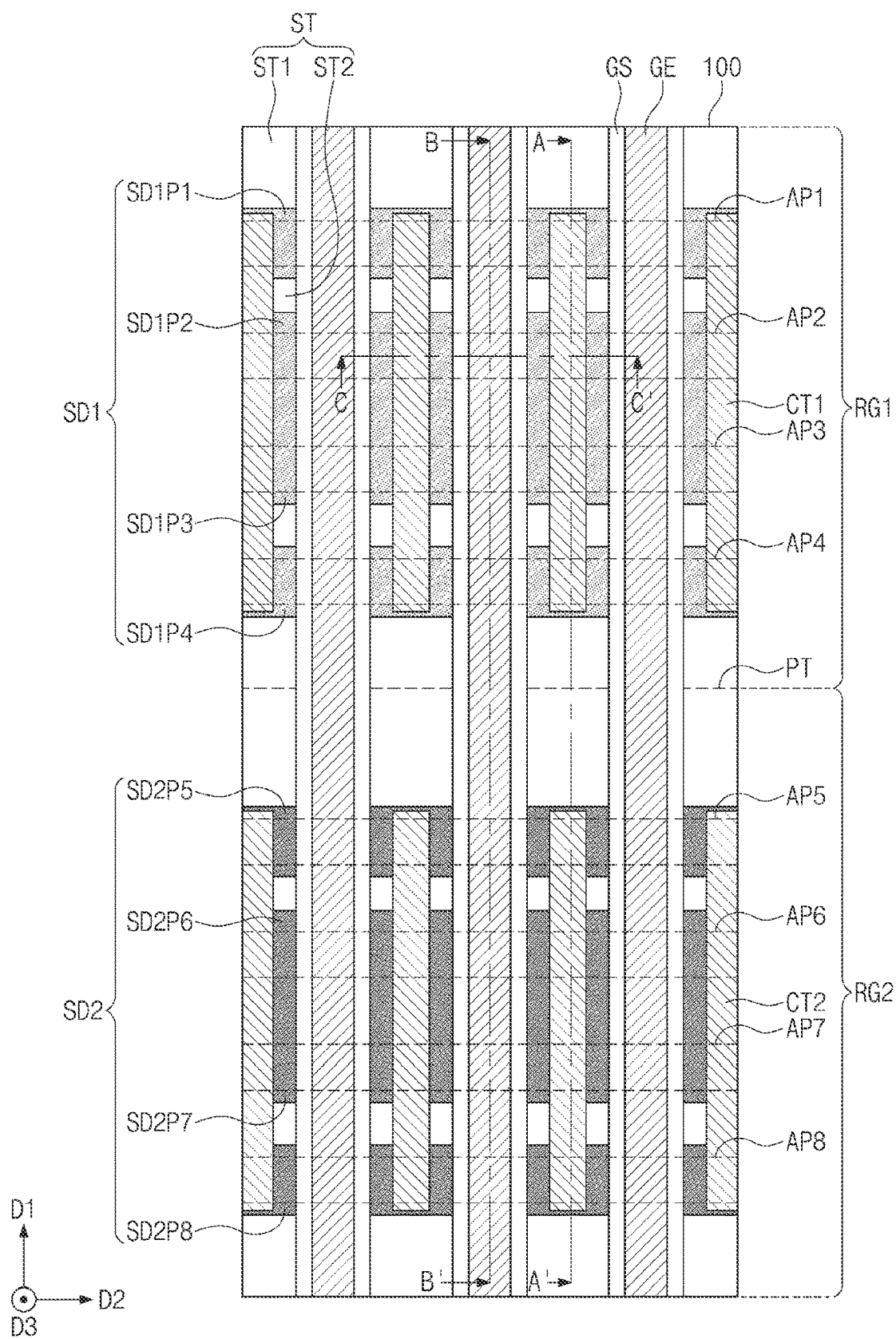
Figure 11B:
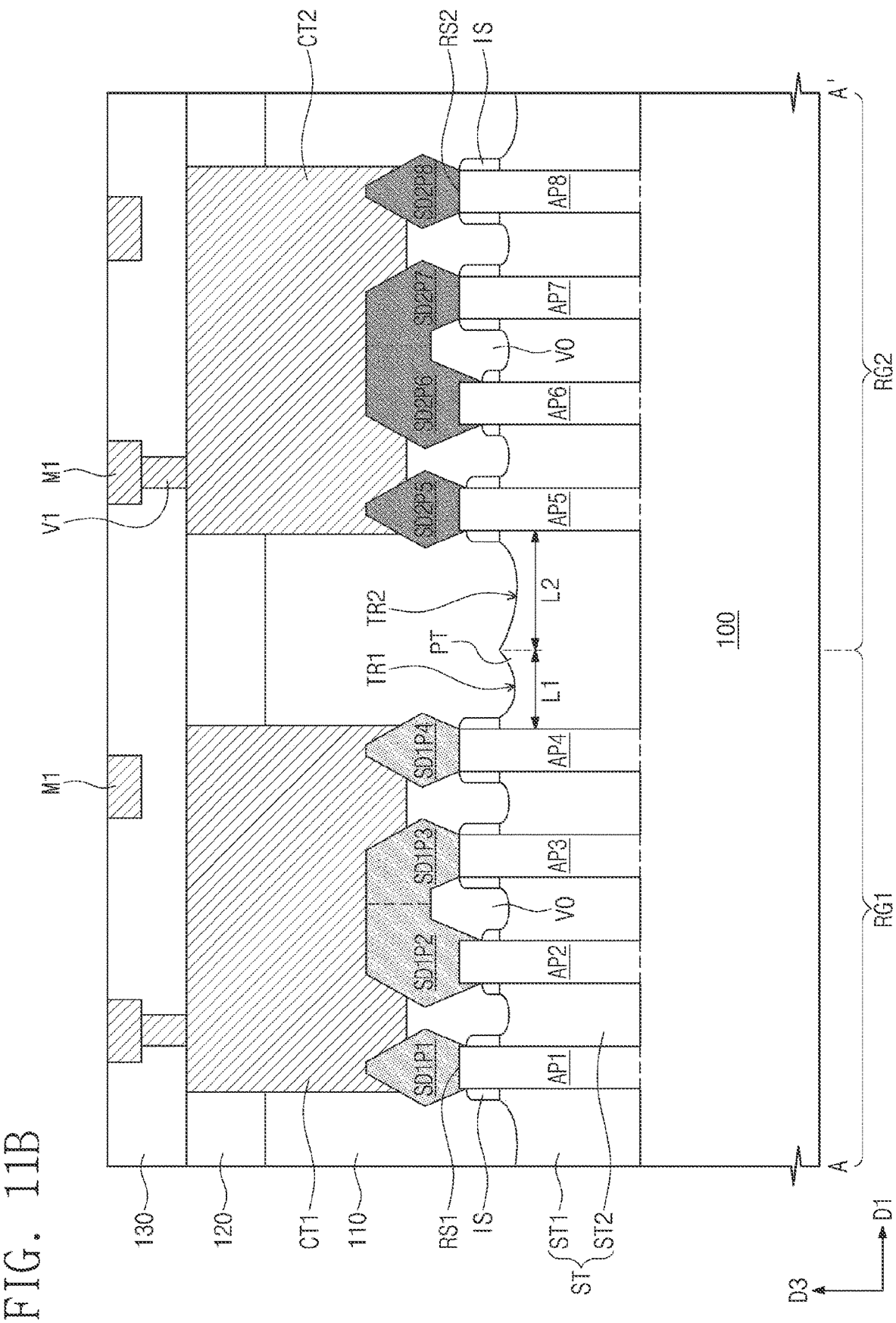
Figure 11C:
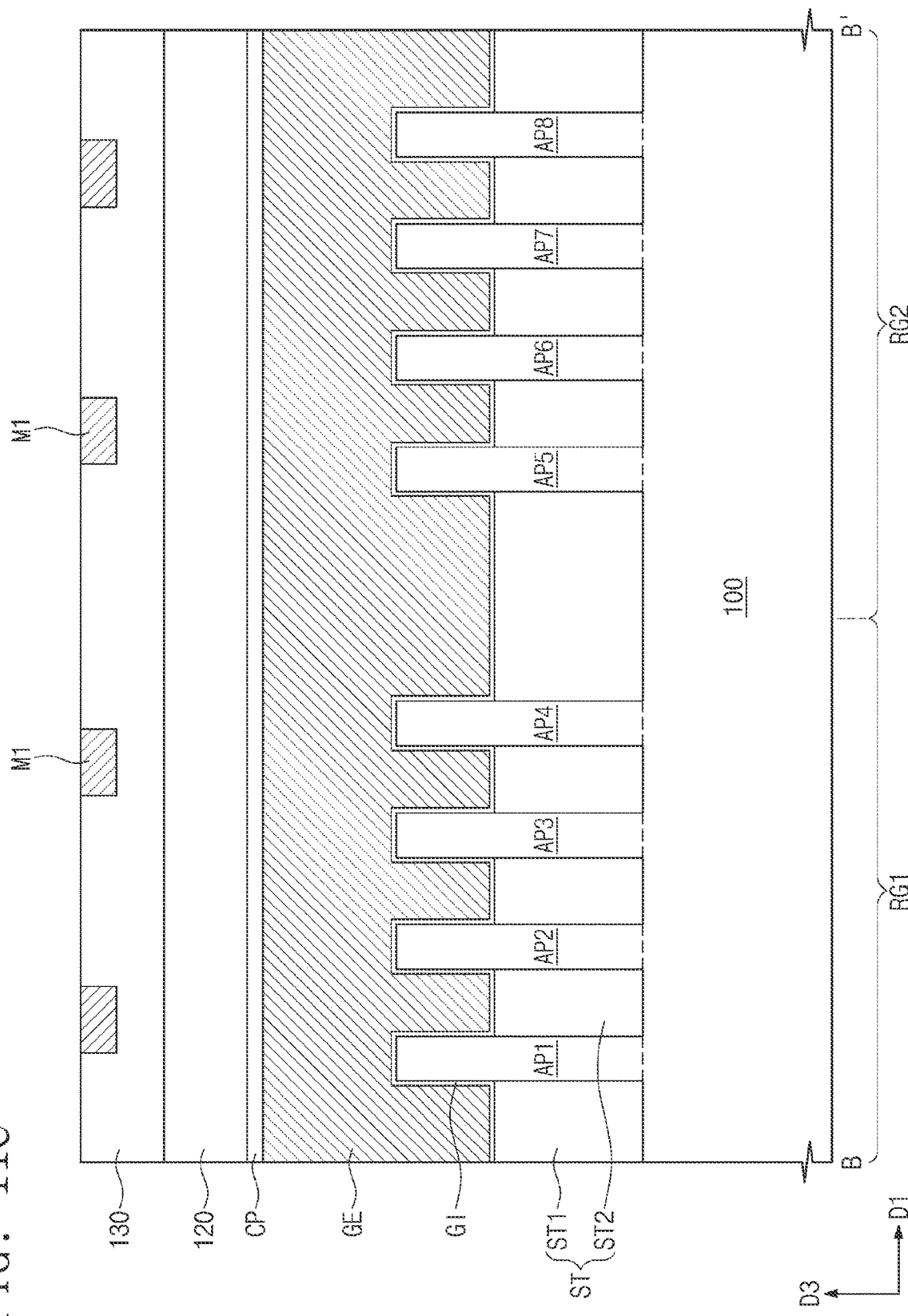
Figure 11D:
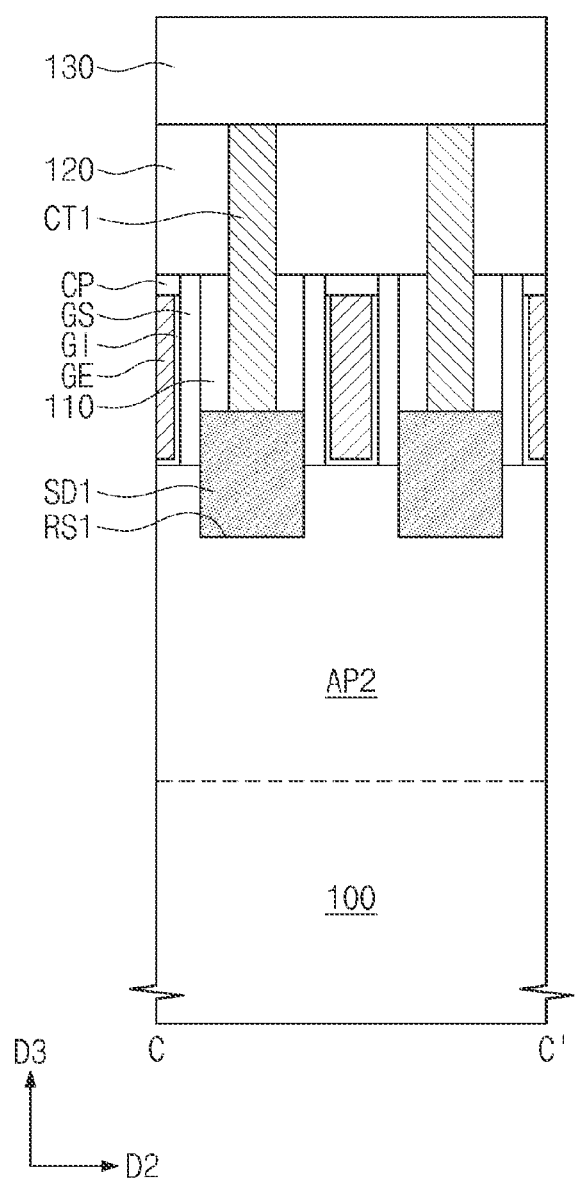

The first and second trenches TR1 and TR2 may define a protrusion PT therebetween, as best seen in FIG. 9B. The protrusion PT may be a portion of the device isolation layer ST provided between the first and second trenches TR1 and TR2. The protrusion PT may extend in the second direction D2.

A first length L1 may refer to a shortest distance in the first direction D1 between the fourth active pattern AP4 and an uppermost portion of the protrusion PT. A second length L2 may refer to a shortest distance in the first direction D1 between the fifth active pattern AP5 and the uppermost portion of the protrusion PT. Stated differently, a first length L1 may refer to a shortest distance in the first direction D1 from the uppermost portion of the protrusion PT to the active pattern on the first region RG1 that is closest to the protrusion PT, and a second length L2 may refer to a shortest direction in the first direction D1 from the uppermost portion of the protrusion PT to the active pattern on the second region RG2 that is closest to the protrusion PT. For example, as shown in FIG. 9B, the first length L1 may be less than the second length L2. For another example, differently from that shown in FIG. 9B, the first length L1 may be the same as or greater than the second length L2.

Referring to FIGS. 10A to 10D, first source/drain patterns SD1 may be formed to fill the first recesses RS1. The formation of the first source/drain patterns SD1 may include performing a selective epitaxial growth process in which the first to fourth active patterns AP1 to AP4 are used as seed layers. Simultaneously with or after the selective epitaxial growth process to form the first source/drain patterns SD1, the first source/drain patterns SD1 may be doped with P-type impurities.

Second source/drain patterns SD2 may be formed to fill the second recesses RS2. The formation of the second source/drain patterns SD2 may include performing a selective epitaxial growth process in which the fifth to eighth active patterns AP5 to AP8 are used as seed layers. The formation of the second source/drain patterns SD2 may be formed simultaneously with the formation of the first source/drain patterns SD1, but the present disclosure is not limited thereto. Simultaneously with or after the selective epitaxial growth process to form the second source/drain patterns SD2, the second source/drain patterns SD2 may be doped with N-type impurities.

Each of the first source/drain patterns SD1 may include first to fourth parts SD1P1 to SD1P4. The first part SD1P1 may be formed on the first active pattern AP1, the second part SD1P2 may be formed on the second active pattern AP2, the third part SD1P3 may be formed on the third active pattern AP3, and the fourth part SD1P4 may be formed on the fourth active pattern AP4. The first part SD1P1 may be spaced apart from the second part SD1P2. The fourth part SD1P4 may be spaced apart from the third part SD1P3. The second part SD1P2 may be merged with the third part SD1P3. The second and third parts SD1P2 and SD1P3 may have therebetween a boundary at a location where the second and third parts SD1P2 and SD2P3 are connected to each other while being selectively epitaxially grown. The first to fourth parts SD1P1 to SD1P4 may have their uppermost portions at the same level.

The first part SD may have a first width W1 corresponding to a maximum width in the first direction D1 and a first height H1 corresponding to a maximum height in a third direction D3. The second part SD1P2 may have a second width W2 corresponding to a maximum width in the first direction D1 and a second height H2 corresponding to a maximum height in the third direction D3. The third part SD1P3 may have a third width W3 corresponding to a maximum width in the first direction D1 and a third height H3 corresponding to a maximum height in the third direction D3. The fourth part SD1P4 may have a fourth width W4 corresponding to a maximum width in the first direction D1 and a fourth height H4 corresponding to a maximum height in the third direction D3.

The second width W2 may be greater than the first width W1, and the second height H2 may be greater than the first height H1. For example, the second part SD1P2 may have a size greater than that of the first part SD1P1. The second part SD1P2 may have a bottom surface whose lowermost level is lower than a lowermost level of a bottom surface of the first part SD1P1. The third width W3 may be less than the second width W2, and the third height H3 may be less than the second height H2. For example, the third part SD1P3 may have a size less than that of the second part SD1P2. The lowermost level of the bottom surface of the second part SD1P2 may be lower than a lowermost level of a bottom surface of the third part SD1P3. The fourth width W4 may be less than the second width W2, and the fourth height H4 may be less than the second height H2. For example, the fourth part SD1P4 may have a size less than that of the second part SD1P2. The lowermost level of the bottom surface of the second part SD1P2 may be lower than a lowermost level of a bottom surface of the fourth part SD1P4.

Each of the second source/drain patterns SD2 may include fifth to eighth parts SD2P5 to SD2P8. The fifth part SD2P5 may be formed on the fifth active pattern AP5, the sixth part SD2P6 may be formed on the sixth active pattern AP6, the seventh part SD2P7 may be formed on the seventh active pattern AP7, and the eighth part SD2P8 may be formed on the eighth active pattern APB. The fifth part SD2P5 may be spaced apart from the sixth part SD2P6. The eighth part SD2P8 may be spaced apart from the seventh part SD2P7. The sixth part SD2P6 may be merged with the seventh part SD2P7. The sixth and seventh parts SD2P6 and SD2P7 may have therebetween a boundary at a location where the sixth and seventh parts SD2P6 and SD2P7 are connected to each other while being selectively epitaxially grown. The fifth to eighth parts SD2P5 to SD2P8 may have their uppermost portions at the same level.

The fifth part SD2P5 may have a fifth width W5 corresponding to a maximum width in the first direction D1 and a fifth height H5 corresponding to a maximum height in the third direction D3. The sixth part SD2P6 may have a sixth width W6 corresponding to a maximum width in the first direction D1 and a sixth height H6 corresponding to a maximum height in the third direction D3. The seventh part SD2P7 may have a seventh width W7 corresponding to a maximum width in the first direction D1 and a seventh height H7 corresponding to a maximum height in the third direction D3. The eighth part SD2P8 may have an eighth width W8 corresponding to a maximum width in the first direction D1 and an eighth height H8 corresponding to a maximum height in the third direction D3.

The sixth width W6 may be greater than the fifth width W5, and the sixth height H6 may be greater than the fifth height H5. For example, the sixth part SD2P6 may have a size greater than that of the fifth part SD2P5. The sixth part SD2P6 may have a bottom surface whose lowermost level is lower than a lowermost level of a bottom surface of the fifth part SD2P5. The seventh width W7 may be less than the sixth width W6, and the seventh height H7 may be less than the sixth height H6. For example, the seventh part SD2P7 may have a size less than that of the sixth part SD2P6. The lowermost level of the bottom surface of the sixth part SD2P6 may be lower than a lowermost level of a bottom surface of the seventh part SD2P7. The eighth width W8 may be less than the sixth width W6, and the eighth height H8 may be less than the sixth height H6. For example, the eighth part SD2P8 may have a size less than that of the sixth part SD2P6. The lowermost level of the bottom surface of the sixth part SD2P6 may be lower than a lowermost level of a bottom surface of the eighth part SD2P8.

A void VO may be formed between the second and third parts SD1P2 and SD1P3 of the first source/drain pattern SD1. A void VO may also be formed between the sixth and seventh parts SD2P6 and SD2P7 of the second source/drain pattern SD2. The voids VO may be substantially empty spaces.

Referring to FIGS. 11A to 11D, a first interlayer dielectric layer 110 may be formed on the substrate 100. A planarization process may be performed on the first interlayer dielectric layer 110 until top surfaces of the sacrificial patterns PP are exposed. When the first interlayer dielectric layer 110 is planarized, the mask patterns MP may be removed.

The planarization process may remove the exposed sacrificial patterns PP. The removal of the sacrificial patterns PP may form empty spaces each of which is provided between a pair of neighboring gate spacers GS. The empty spaces may expose the first to eighth active patterns AP1 to AP8.

A gate dielectric pattern GI and a gate electrode GE may be formed in each of the empty spaces. The formation of the gate dielectric pattern GI and the gate electrode GE may include conformally forming a gate dielectric layer in the empty space and forming a gate electrode layer to completely fill the empty space. The filling of the empty space with the gate electrode layer may form the gate electrode GE. Gate capping patterns CP may be formed on the gate electrodes GE.

A second interlayer dielectric layer 120 may be formed on the first interlayer dielectric layer 110 and the gate capping patterns CP. First contacts CT1 may be formed to penetrate the first and second interlayer dielectric layers 110 and 120 and to come into connection with the first source/drain patterns SD1. Second contacts CT2 may be formed to penetrate the first and second interlayer dielectric layers 110 and 120 and to come into connection with the second source/drain patterns SD2.

A third interlayer dielectric layer 130 may be formed on the second interlayer dielectric layer 120, the first contacts CT1, and the second contacts CT2.

Via contacts V1 and wiring lines M1 may be formed in the third interlayer dielectric layer 130. The via contact V1 may electrically connect the wiring line M1 to the first contact CT1 or to the second contact CT2.

A semiconductor device according to some example embodiments of the present inventive concepts will now be described, with reference to FIGS. 11A to 11D.

The device isolation layer ST may be provided on the substrate 100. The device isolation layer ST may define the first to eighth active patterns AP1 to AP8 on an upper portion of the substrate 100. The first to fourth active patterns AP1 to AP4 may be provided on the first region RG1 of the substrate 100. The fifth to eighth active patterns AP5 to AP8 may be provided on the second region RG2 of the substrate 100. The device isolation layer ST may have a top surface lower than those of the first to eighth active patterns AP1 to AP8.

The first to eighth active patterns AP1 to AP8 may be sequentially arranged along the first direction D1. Each of the first to eighth active patterns AP1 to AP8 may extend in the second direction D2. The first recesses RS1 may be correspondingly provided on the first to fourth active patterns AP1 to AP4. The second recesses RS2 may be correspondingly provided on the fifth to eighth active patterns AP5 to AP8.

The first source/drain patterns SD1 may be provided on the first to fourth active patterns AP1 to AP4. The first source/drain patterns SD1 may fill the first recesses RS1. Each of the first source/drain patterns SD1 may include the first to fourth parts SD1P1 to SD1P4. The second and third parts SD1P2 and SD1P3 may be merged with each other. The first part SD1P1 may be spaced apart from the second part SD1P2. The second part SD1P2 may be larger than the first part SD1P1. The third part SD1P3 may be smaller than the second part SD1P2.

The second source/drain patterns SD2 may be provided on the fifth to eighth active patterns AP5 to AP8. The second source/drain patterns SD2 may fill the second recesses RS2. Each of the second source/drain patterns SD2 may include the fifth to eighth parts SD2P5 to SD2P8. The sixth and seventh parts SD2P6 and SD2P7 may be merged with each other. The fifth part SD2P5 may be spaced apart from the sixth part SD2P6. The sixth part SD2P6 may be larger than the fifth part SD2P5. The seventh part SD2P7 may be smaller than the sixth part SD2P6.

The gate electrodes GE may be provided to extend in the first direction D1, while running across the first to eighth active patterns AP1 to AP8. The gate electrodes GE may be spaced apart from each other in the second direction D2. For example, the gate electrode GE may include one or more of conductive metal nitride (e.g., titanium nitride or tantalum nitride) and metal (e.g., titanium, tantalum, tungsten, copper, or aluminum).

A pair of gate spacers GS may be on opposite sidewalls of each of the gate electrodes GE. The gate spacers GS may extend in the first direction D1 along the gate electrode GE. The gate spacers GS may have top surfaces higher than that of the gate electrode GE. The top surfaces of the gate spacers GS may be coplanar with that of the first interlayer dielectric layer 110.

The gate dielectric pattern GI may be interposed between each of the gate electrodes GE and each of the first to eighth active patterns AP1 to AP8. The gate dielectric pattern GI may lie between the gate electrode GE and each of the gate spacers GS. The gate dielectric pattern GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate capping pattern CP may be provided on each of the gate electrodes GE. The gate capping pattern CP may extend in the first direction D1 along the gate electrode GE.

The first interlayer dielectric layer 110 may be provided on an entire surface of the substrate 100. The first interlayer dielectric layer 110 may cover the device isolation layer ST, the gate electrodes GE, and the first and second source/drain patterns SD1 and SD2. The first interlayer dielectric layer 110 may have a top surface substantially coplanar with those of the gate capping patterns CP. The second interlayer dielectric layer 120 may be provided on the first interlayer dielectric layer 110.

The first contacts CT1 may be provided to penetrate the first and second interlayer dielectric layers 110 and 120 and to come into connection with the first source/drain patterns SD1. The second contacts CT2 may be provided to penetrate the first and second interlayer dielectric layers 110 and 120 and to come into connection with the second source/drain patterns SD2.

The third interlayer dielectric layer 130 may be provided on the second interlayer dielectric layer 120, the first contacts CT1, and the second contacts CT2. The via contacts V1 and the wiring lines M1 may be provided in the third interlayer dielectric layer 130.

Although FIGS. 1A to 5 show four active patterns AP1 to AP4, this number of active patterns is merely an example used herein to discuss the inventive concepts disclosed herein, and in some embodiments there may be less than four active patterns or greater than four active patterns. Likewise, although FIGS. 6A to 11D show four active patterns AP1 to AP4 on the first region RG1, and four active patterns AP5 to AP8 on the second region RG2, these numbers of active patterns are merely examples used herein to discuss the inventive concepts disclosed herein, and in some embodiments there may be less than four active patterns on each region or greater than four active patterns on each region. In some embodiments, the number of active patterns in each region RG1 and RG2 may be different.

A semiconductor device according to some of the present inventive concepts may include variously shaped source/drain patterns, and thus may have improved electrical characteristics.

Although some examples of embodiments of the inventive concepts disclosed herein have been discussed with reference to the accompanying figures, it will be understood that various changes in form and details may be made therein without departing from the scope of the present disclosure. It therefore will be understood that the some example embodiments described above are merely illustrative, and are not limitative in all aspects.

What is claimed is:

1. A semiconductor device comprising:
    a substrate;
    a first fin, a second fin, a third fin and a fourth fin on the substrate;
    a first isolation on the substrate;
    a second isolation on the substrate and between the first fin and the second fin, the first fin between the first isolation and the second isolation;
    a third isolation on the substrate and between the second fin and the third fin;
    a fourth isolation on the substrate and between the third fin and the fourth fin;
    a fifth isolation on the substrate, the fourth fin between the fourth isolation and the fifth isolation;
    a first gate on the first through fourth fins and the first through fifth isolations;
    a second gate on the first through fourth fins and the first through fifth isolations;
    a first epitaxial source/drain on the first fin and between the first gate and the second gate;
    a second epitaxial source/drain on the second fin and between the first gate and the second gate;
    a third epitaxial source/drain on the third fin and between the first gate and the second gate;
    a fourth epitaxial source/drain on the fourth fin and between the first gate and the second gate; and
    a contact on the first through fourth epitaxial source/drain,
    wherein the first, second, third and fourth epitaxial source/drains are merged into a merged epitaxial source/drain, and
    wherein an upper surface of the merged epitaxial source/drain includes a first recess and a second recess.

2. The semiconductor device of claim 1, wherein a depth of the first recess is different from a depth of the second recess.

3. The semiconductor device of claim 1, wherein an upper surface of the third epitaxial source/drain is concave.

4. The semiconductor device of claim 1, wherein a void is between the merged epitaxial source/drain, the second fin and the third fin.

5. The semiconductor device of claim 1, further comprising:
    a via on the contact; and
    a wiring line on the via.

6. The semiconductor device of claim 1, wherein the contact includes titanium, tantalum, tungsten, copper or aluminum.

7. A semiconductor device comprising:
    a substrate;
    a first fin, a second fin and a third fin on the substrate;
    a first epitaxial source/drain on the first fin;
    a second epitaxial source/drain on the second fin;
    a third epitaxial source/drain on the third fin; and
    a contact in contact with the first, second and third epitaxial source/drains,
    wherein the first, second and third epitaxial source/drains are merged into a merged epitaxial source/drain,
    wherein an upper surface of the merged epitaxial source/drain includes a first recess and a second recess,
    wherein a depth of the first recess is different from a depth of the second recess.

8. The semiconductor device of claim 7, further comprising:
    a fourth fin on the substrate; and
    a fourth epitaxial source/drain on the fourth fin,
    wherein the merged epitaxial source/drain has a flat top surface that connects an uppermost portion of the third epitaxial source/drain to an uppermost portion of the fourth epitaxial source/drain.

9. The semiconductor device of claim 7, wherein the depth of the second recess is less than the depth of the first recess.

10. The semiconductor device of claim 9, wherein a width of a bottom of the second recess is greater than a width of a bottom of the first recess.

11. The semiconductor device of claim 9, wherein a level of a bottom of the second recess is higher than a level of a bottom of the first recess.

12. The semiconductor device of claim 7, wherein a void is between the merged epitaxial source/drain, the second fin and the third fin.

13. The semiconductor device of claim 7, wherein the contact includes a first interposed portion in the first recess and a second interposed portion in the second recess,
wherein a height of the first interposed portion is different from a height of the second interposed portion.

14. The semiconductor device of claim 13, wherein a width of a bottom of the first interposed portion is different from a width of a bottom of the second interposed portion.

15. A semiconductor device comprising:
a substrate;
a first fin, a second fin and a third fin on the substrate;
a first epitaxial source/drain on the first fin;
a second epitaxial source/drain on the second fin;
a third epitaxial source/drain on the third fin; and
a contact in contact with the first, second and third epitaxial source/drains,
wherein the first, second and third epitaxial source/drains are merged into a merged epitaxial source/drain,
wherein an upper surface of the merged epitaxial source/drain includes a first recess and a second recess,
wherein the contact includes a first interposed portion in the first recess and a second interposed portion in the second recess,
wherein a height of the first interposed portion is different from a height of the second interposed portion.

16. The semiconductor device of claim 15, wherein a width of a bottom of the first interposed portion is different from a width of a bottom of the second interposed portion.

17. The semiconductor device of claim 15, wherein the first interposed portion is between an uppermost portion of the first epitaxial source/drain and an uppermost portion of the second epitaxial source/drain,
wherein the second interposed portion is between the uppermost portion of the second epitaxial source/drain and an uppermost portion of the third epitaxial source/drain.

18. The semiconductor device of claim 15, further comprising:
a fourth fin on the substrate; and
a fourth epitaxial source/drain on the fourth fin,
wherein the merged epitaxial source/drain has a flat top surface that connects an uppermost portion of the third epitaxial source/drain to an uppermost portion of the fourth epitaxial source/drain.

19. The semiconductor device of claim 18, wherein a level of bottom of the first interposed portion and a level of bottom of the second interposed portion are lower than a level of the flat top surface.

20. The semiconductor device of claim 18, wherein a level of an uppermost portion of the first epitaxial source/drain, a level of an uppermost portion of the second epitaxial source/drain and a level of the flat top surface are same.

* * * * *